United States Patent
Park

(10) Patent No.: US 7,502,263 B2
(45) Date of Patent: Mar. 10, 2009

(54) NON-VOLATILE MEMORY DEVICES AND METHODS OF PROGRAMMING THE SAME

(75) Inventor: Jung-Hoon Park, Hwaseong-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 104 days.

(21) Appl. No.: 11/606,285

(22) Filed: Nov. 30, 2006

(65) Prior Publication Data

US 2008/0089130 A1   Apr. 17, 2008

(30) Foreign Application Priority Data

Oct. 12, 2006   (KR) .................... 10-2006-0099116

(51) Int. Cl.
*G11C 11/34* (2006.01)
(52) U.S. Cl. ............................ 365/185.17; 365/185.18; 365/185.21; 365/185.23
(58) Field of Classification Search ............ 365/185.03, 365/185.11, 185.17, 185.18, 185.29, 185.33, 365/185.21, 185.23
See application file for complete search history.

(56) References Cited

U.S. PATENT DOCUMENTS

| | | | |
|---|---|---|---|
| 5,473,563 A | | 12/1995 | Suh et al. |
| 5,606,527 A | * | 2/1997 | Kwack et al. .......... 365/185.17 |
| 5,696,717 A | | 12/1997 | Koh |
| 5,969,990 A | * | 10/1999 | Arase .................... 365/185.17 |
| 6,240,014 B1 | * | 5/2001 | Yoo ...................... 365/185.03 |
| 6,469,933 B2 | * | 10/2002 | Choi et al. ............. 365/185.17 |
| 6,853,585 B2 | * | 2/2005 | Lee et al. ............... 365/185.18 |
| 7,064,981 B2 | * | 6/2006 | Roohparvar ........... 365/185.17 |
| 7,126,856 B2 | * | 10/2006 | Sun et al. ............... 365/185.29 |
| 7,149,124 B2 | * | 12/2006 | Nazarian ............... 365/185.18 |
| 7,161,837 B2 | * | 1/2007 | Park ..................... 365/185.17 |
| 7,180,787 B2 | * | 2/2007 | Hosono et al. ......... 365/185.17 |
| 7,184,307 B2 | * | 2/2007 | Lee ........................ 365/185.11 |
| 7,269,068 B2 | * | 9/2007 | Chae et al. ............. 365/185.18 |
| 7,298,648 B2 | * | 11/2007 | Lee et al. ............... 365/185.03 |
| 7,355,889 B2 | * | 4/2008 | Hemink et al. ......... 365/185.17 |

FOREIGN PATENT DOCUMENTS

| | | |
|---|---|---|
| JP | 2000-048581 | 2/2000 |
| JP | 2002-260390 | 9/2002 |
| KR | 100145475 | 4/1998 |

* cited by examiner

*Primary Examiner*—Trong Phan
(74) *Attorney, Agent, or Firm*—Harness, Dickey & Pierce, P.L.C.

(57) ABSTRACT

A non-volatile semiconductor memory device and method of programming the non-volatile semiconductor memory device are disclosed. The non-volatile semiconductor memory device includes a selected word-line and unselected word-lines including at least one unselected word-line to which a first voltage signal is applied. The selected word-line is coupled to a selected memory transistor and receives a program voltage signal in response to a program voltage enable signal. A first voltage signal is applied to the at least one unselected word-line. The first voltage signal has a voltage level of a reduced pass voltage signal before the program voltage enable signal is activated and has a voltage level of a pass voltage signal while the program voltage enable signal is activated.

27 Claims, 21 Drawing Sheets

2300

NON-VOLATILE MEMORY DEVICES AND METHODS OF PROGRAMMING THE SAME

PRIORITY STATEMENT

This non-provisional U.S. patent application claims priority under 35 USC § 119 to Korean Patent Application No. 2006-99116, filed on Oct. 12, 2006, in the Korean Intellectual Property Office (KIPO), the entire contents of which are incorporated herein by reference.

BACKGROUND

Description of the Conventional Art

Conventional semiconductor memory devices may be volatile or non-volatile. In a conventional volatile semiconductor memory device, data is stored as a logic state of a bi-stable flip-flop or charge/discharge of a capacitor. Data is stored only while electric power is applied, and data is erased when the electric power is off.

A conventional non-volatile semiconductor memory device such as electrically erasable programmable read only memory (EEPROM) stores data even when the electric power is off. Conventional non-volatile semiconductor memory devices may be used in larger areas of application such as computers and/or portable communication systems to store programs and/or data. EEPROM electrically erases or writes data, and thus, it is more widely used, not only in auxiliary memory devices, but also in memory devices for system programming requiring continuous renewal.

A NAND-type flash memory device may have a higher level of integration than the NOR-type flash memory device. A conventional NAND-type flash memory device may include memory cell arrays for storing data. The memory cell array may include a plurality of cell strings referred to as NAND strings. The NAND-type flash memory device erases or programs the memory cell array using, for example, Fowler-Nordheim (F-N) tunneling current.

FIG. 1 is a circuit diagram illustrating a memory cell array included in a conventional NAND-type flash memory device.

Referring to FIG. 1, the memory cell array includes selection transistors ST11 to ST1n and GT11 to GT1n and memory transistors M11 to M16n coupled to bit-lines BL1 to BLn, selection lines SSL and GSL and word-lines WL1 to WL16. In the memory cell array shown in FIG. 1, a program voltage signal VPGM is applied to a selected word-line WL2 coupled to the memory transistor M2n to be programmed and a pass voltage signal VPASS is applied to unselected word-lines.

During programming, electrons are accumulated in a floating gate. During erasing, electrons accumulated in the floating gate are pushed out into the surface of a channel. When erasing is completed, the threshold voltage is decreased. The threshold voltage is increased when the memory transistor is programmed to data "0". On the other hand, the threshold voltage of the erased state is maintained when the memory transistor is programmed to data "1".

In the conventional NAND-type flash memory device including the memory cell array shown in FIG. 1, when the pass voltage signal VPASS is increased, threshold voltages of the unselected memory transistors M1n, M3n to M16n associated with memory transistor M2n may be increased. For example, unwanted programming may occur for the unselected memory transistors M1n, M3n to M16n. When the pass voltage signal VPASS is decreased, the voltage VPGM-VET between a control gate and a channel of the selected memory transistor M2l, for maintaining erased data or data "1", is increased. Therefore, the threshold voltage of the selected memory transistor M21 may become higher than the threshold voltage of the erase state. In this example, VET denotes a channel voltage of the selected memory transistor M21. Accordingly, the threshold voltage of the selected memory transistor M21, for maintaining data "1", may be increased. In addition, the threshold voltages of the unselected memory transistors M1n and M3n, which are adjacent to (e.g., neighboring) the selected memory transistor M2n to be programmed to data "0", may be increased.

FIG. 2 is a graph illustrating variation of a threshold voltage of a memory transistor coupled to a selected word-line when a pass voltage varies.

In FIG. 2, curve "A" illustrates variation of the threshold voltage of each of unselected memory transistors included in a NAND cell unit associated with selected memory transistors, which may be coupled to selected bit-lines to be programmed with data "0". Curve "B" illustrates variation of the threshold voltage of the selected memory transistors for maintaining erased data or data "1". The curves of FIG. 2 represent measured values when the program voltage signal of 18V is applied after an erase operation is performed such that the threshold voltage of each of the memory transistors is set at −3V.

As illustrated in FIG. 2, the dependence of the two curves A and B on the pass voltage signal VPASS may be opposite to each other. When the maximum value of the threshold voltage of each of the memory transistors is set to −1V, the pass voltage signal may be limited to within a window margin WINDOW. In one example, the pass voltage signal VPASS may be between 7V and 13V.

FIG. 3 is a circuit diagram illustrating a memory cell array included in a conventional NAND-type flash memory device.

FIG. 4 is a timing diagram illustrating an example operation of the conventional NAND-type flash memory device shown in FIG. 3.

Referring to FIG. 3, the row decoder 11 is coupled to bit-lines BL1 to BLn, selection lines SSL and GSL and word-lines WL1 to WL16. The memory cell array includes selection transistors ST11 to ST1n and GT11 to GT1n, and memory transistors M11 to M16n coupled to bit-lines BL1 to BLn, selection lines SSL and GSL and word-lines WL1 to WL16.

In the memory cell array of FIG. 3, the program voltage signal VPGM is applied to the selected word-line WL2 coupled to the memory transistor M2n to be programmed. The pass voltage signal VPASS2 is applied to the unselected word-lines WL1 and WL3 adjacent to (e.g., directly neighboring) the selected word-line WL2, and the pass voltage signal VPASS1 is applied to the unselected word-lines WL4 to WL16 not adjacent to (e.g., directly neighboring) the selected word-line WL2.

As shown in FIG. 4, the level of the pass voltage signal VPASS2 applied to the unselected word-lines WL1 and WL3 adjacent to the selected word-line WL2 is lower than the level of the pass voltage signal VPASS1 coupled to the unselected word-lines WL4 to WL16 not adjacent to the selected word-line WL2. As a result, coupling effect on the unselected word-lines WL1 and WL3 adjacent to the selected word-line WL2 may decrease when the program voltage signal VPGM is applied to the selected word-line. Coupling effect may be caused by the program voltage signal VPGM. Accordingly, undesirable programming on the memory transistors coupled to the unselected word-line may be suppressed.

The method of programming the memory cell array illustrated in FIG. 3 may decrease the level of the pass voltage signal VPASS2 applied to the unselected word-lines WL1 and WL3 adjacent to the selected word-line WL2. Therefore, the boosting efficiency of the unselected string coupled to the unselected word-lines WL1 and WL3 adjacent to the selected word-line WL2 may be decreased. For example, the method of programming the memory cell array illustrated in FIG. 3 may decrease the boosting efficiency of the unselected string including the selection transistors ST11 and GT11 and the memory transistors M11 to M161 coupled to the bit-line BL1. If the boosting efficiency of the unselected string is decreased, the undesirable or unwanted programming may occur in memory transistors M11 to M161 coupled to the bit-line BL1.

SUMMARY

Example embodiments relate non-volatile semiconductor memory devices, for example, NAND-type flash memory devices and methods of programming the same.

At least some example embodiments provide a NAND-type non-volatile semiconductor memory device that may suppress undesirable and/or unwanted programming on the memory transistors coupled to an unselected word-line of a selected string.

At least some example embodiments provide a non-volatile semiconductor memory device that may suppress and/or prevent undesirable and/or unwanted programming of the memory transistors coupled to an unselected word-line of the selected string.

At least some example embodiments provide methods of programming a non-volatile semiconductor memory device that may suppress and/or prevent unwanted and/or undesirable programming of the memory transistors coupled to an unselected word-line of the selected string.

In at least some example embodiments, a non-volatile semiconductor memory device may include a row decoder, a selected word-line and/or unselected word-lines including at least one unselected word-line to which a first voltage signal may be applied. The row decoder may generate a program voltage signal, a pass voltage signal and a reduced pass voltage signal in response to a program voltage enable signal, a pass voltage enable signal, a reduced pass voltage enable signal and a boost voltage. The reduced pass voltage signal may have a voltage level lower than a voltage level of the pass voltage signal. The selected word-line may be coupled to a selected memory transistor, and may receive the program voltage signal in response to the program voltage enable signal. The first voltage signal may have a voltage level of the reduced pass voltage signal before the program voltage enable signal is activated, and may have a voltage level of the pass voltage signal while the program voltage enable signal is activated.

In at least some example embodiments, the first voltage signal may transition to a voltage level of the reduced pass voltage signal in response to the reduced pass voltage enable signal, and may transition to a voltage level of the pass voltage signal in response to the pass voltage enable signal. A voltage signal may be applied to the selected word-line. The voltage signal may transition to a voltage level of the pass voltage signal in response to the pass voltage enable signal, and may transition to a voltage level of the program voltage signal in response to the program voltage enable signal. The first voltage signal may be applied to the at least one word-line adjacent to pr directly neighboring the selected word-line. The pass voltage signal may be applied to the unselected word-lines that are not adjacent to or directly neighboring the selected word-line in response to the pass voltage enable signal.

In at least some example embodiments, a non-volatile semiconductor memory device may include a memory cell array having a plurality of memory transistors, a voltage generating circuit, a control circuit and/or a row decoder. The voltage generating circuit may generate a program voltage signal, a pass voltage signal and a boost voltage. The control circuit may generate a program voltage enable signal, a pass voltage enable signal and a reduced pass voltage enable signal in response to a command signal and a row address signal. The row decoder may generate a first program voltage signal, a first voltage signal and a second voltage signal. The row decoder may provide the first program voltage signal, the first voltage signal and the second voltage signal to word-lines coupled to the memory cell array. The first program voltage signal may transition to a voltage level of the program voltage signal in response to the program voltage enable signal. The first voltage signal may transition to a voltage level of the pass voltage signal in response to the pass voltage enable signal. The second voltage signal may have a voltage level of the reduced pass voltage signal before the program voltage enable signal is activated, and may have a voltage level of the pass voltage signal while the program voltage enable signal is activated.

According to at least some example embodiments, the first program voltage signal may be applied to a first word line coupled to a selected memory transistor to be programmed, and the second voltage signal may be applied to a second word-line adjacent to or directly neighboring the first word-line among word-lines to which unselected memory transistors are coupled, and the first voltage signal may be applied to a third word-line not adjacent to or directly neighboring the first word-line.

According to at least one example embodiment, the first program voltage signal may have a voltage level of ground voltage before the program voltage enable signal is activated, and may have a voltage level of the program voltage signal while the program voltage enable signal is activated.

According to at least one example embodiment, the first program voltage signal may have a voltage level of the pass voltage signal before the program voltage enable signal is activated, and may have a voltage level of the program voltage signal while the program voltage enable signal is activated. The voltage level of the program voltage signal may be higher than the voltage level of the pass voltage signal.

In at least some example embodiments, a method of programming a non-volatile semiconductor memory device may include providing a pass voltage signal to an unselected word-line not adjacent to or directly neighboring a selected word-line. A reduced pass voltage signal may be provided to an unselected word-line adjacent to or directly neighboring the selected word-line and the reduced pass voltage may have a lower voltage level than a voltage level of the pass voltage signal. The pass voltage signal may be provided to the unselected word-line adjacent to or directly neighboring the selected word-line, and a program voltage signal may be provided to the selected word-line when the pass voltage signal is provided to the unselected word-line adjacent to or directly neighboring the selected word-line.

In at least some example embodiments, a method of programming a non-volatile semiconductor memory device may include providing a pass voltage signal to an unselected word-line not adjacent to or directly neighboring a selected word-line, and providing a reduced pass voltage signal to an unselected word-line adjacent to or directly neighboring the selected word-line. The reduced pass voltage signal may have a lower voltage level than a voltage level of the pass voltage signal. The pass voltage signal may be provided to the selected word-line when the reduced pass voltage signal is provided to the unselected word-line adjacent to or directly neighboring the selected word-line. The pass voltage signal may be provided to the unselected word-line adjacent to or directly neighboring the selected word-line, and a program voltage signal may be provided to the selected word-line when the pass voltage signal is provided to the unselected word-line adjacent to or directly neighboring the selected word-line.

Non-volatile semiconductor memory devices, according to at least some example embodiments, may decrease capacitance coupling effects between a selected word-line and an unselected word-line, and may suppress and/or prevent unwanted and/or undesirable programming of the memory transistors coupled to an unselected word-line of the selected string.

DETAILED DESCRIPTION OF EXAMPLE EMBODIMENTS

Figure 1:
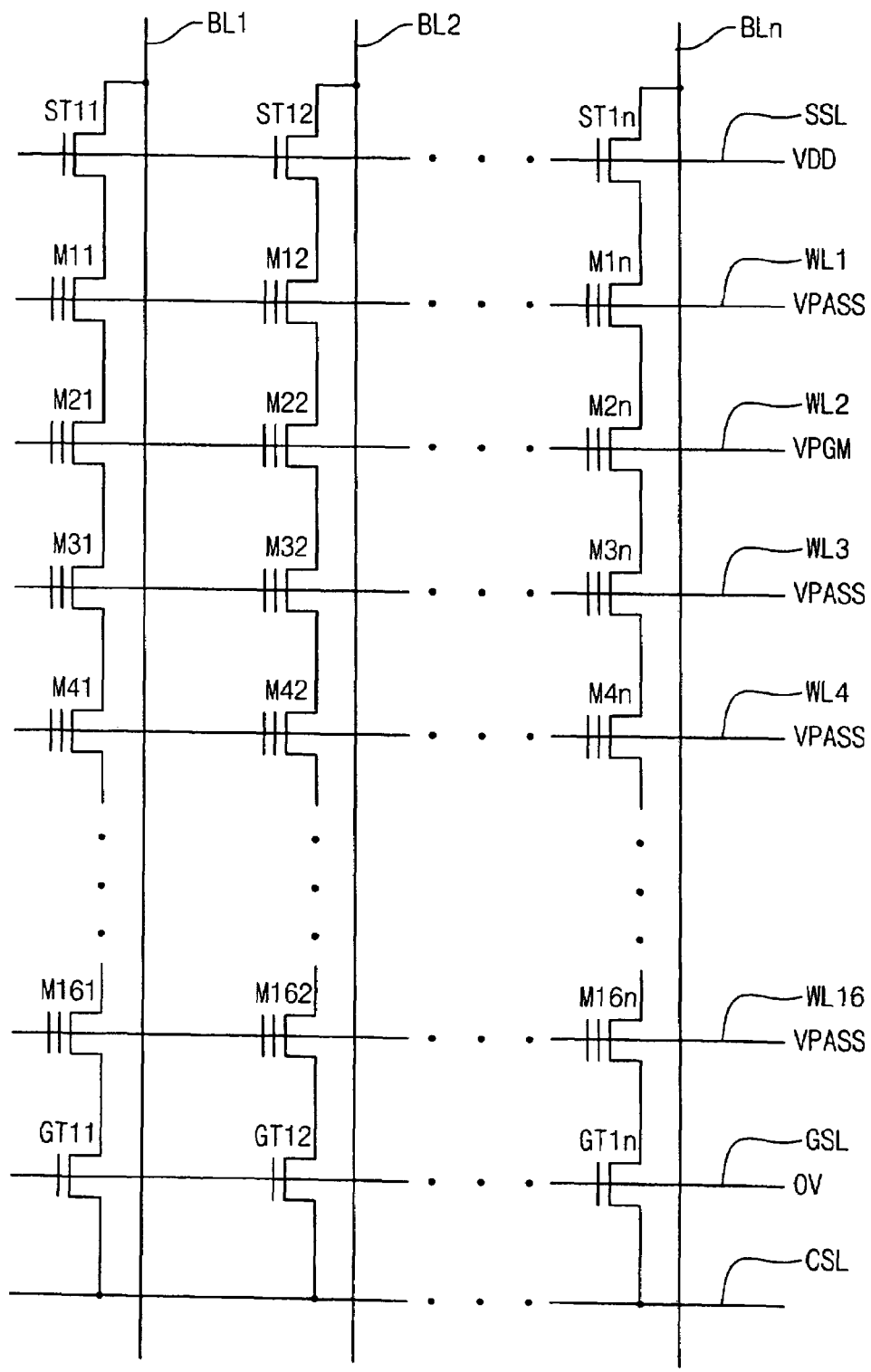
FIG. 1 is a circuit diagram illustrating a portion of a memory cell array in a conventional NAND-type flash memory device.
Figure 2:
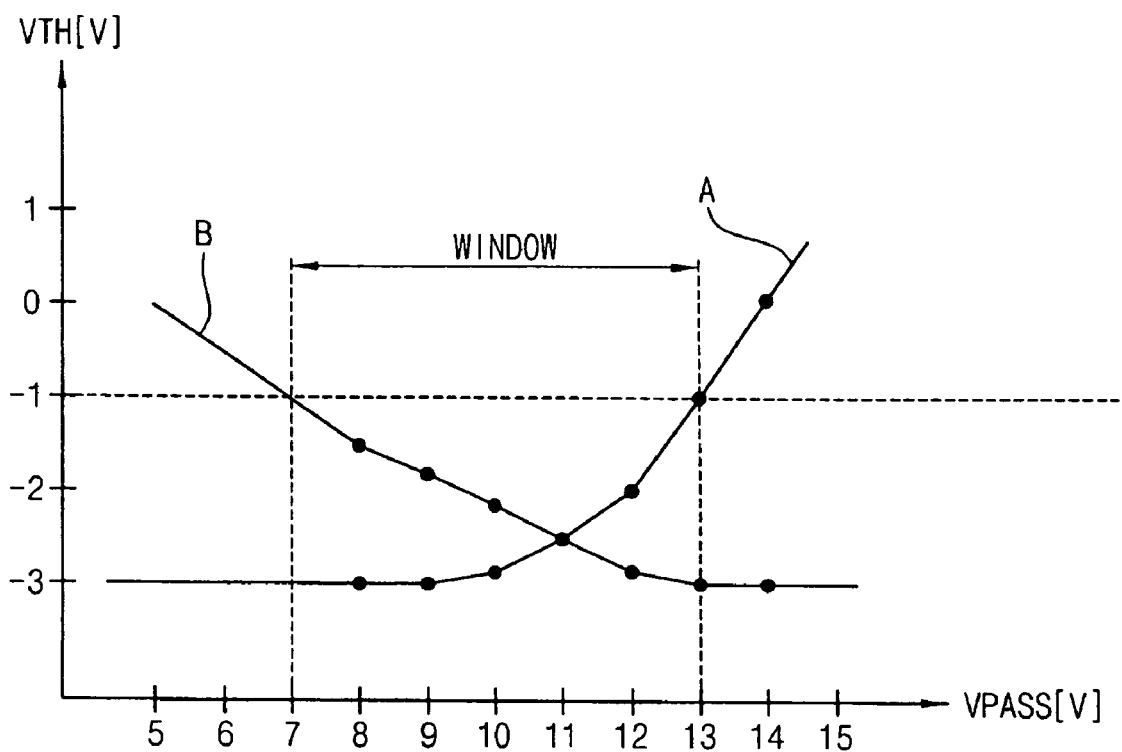
FIG. 2 is a graph illustrating variation of a threshold voltage of a memory transistor coupled to a selected word-line when a pass voltage varies, according to the conventional art.
Figure 3:
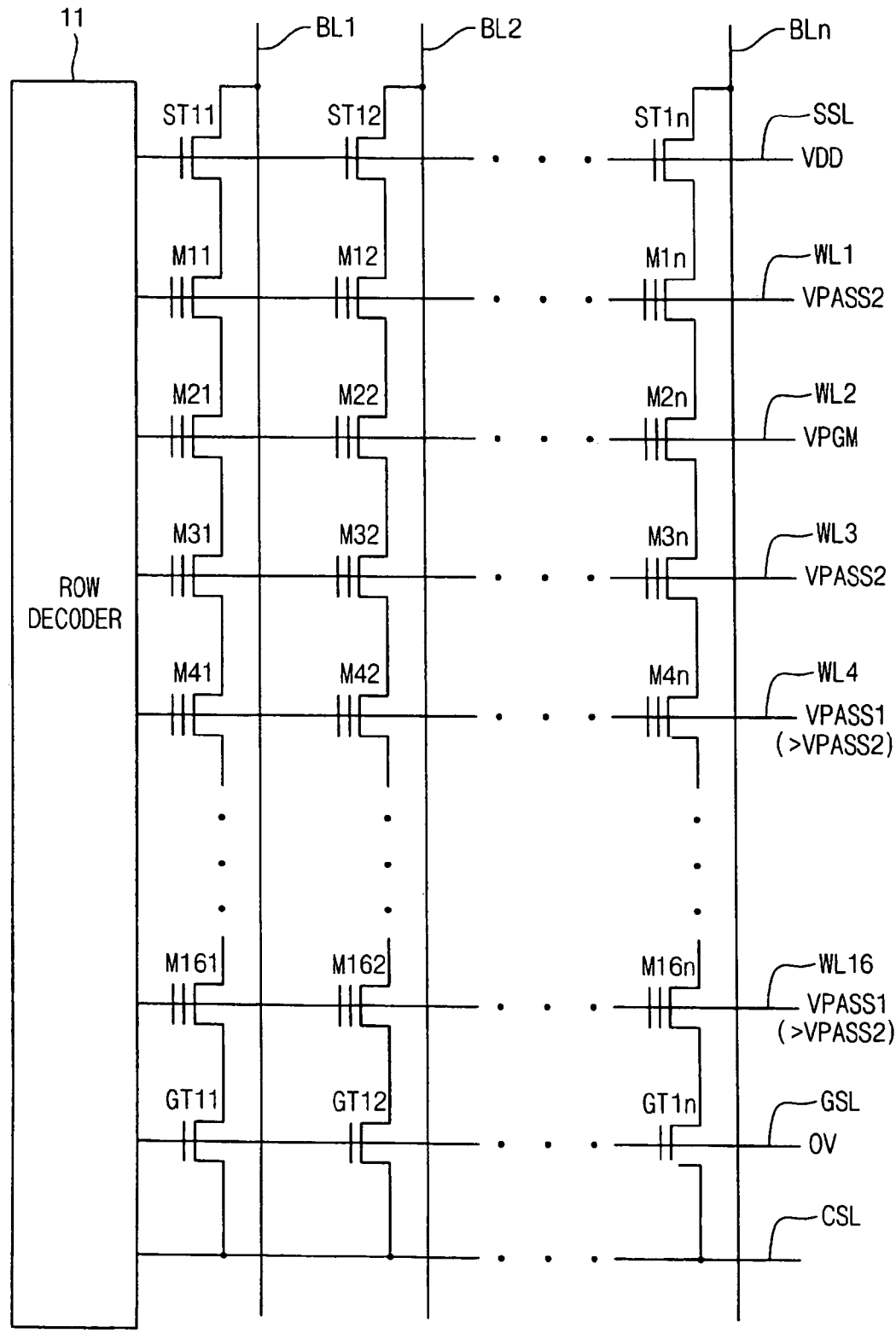
FIG. 3 is a circuit diagram illustrating a part of a memory cell array included in a conventional NAND-type flash memory device.
Figure 4:
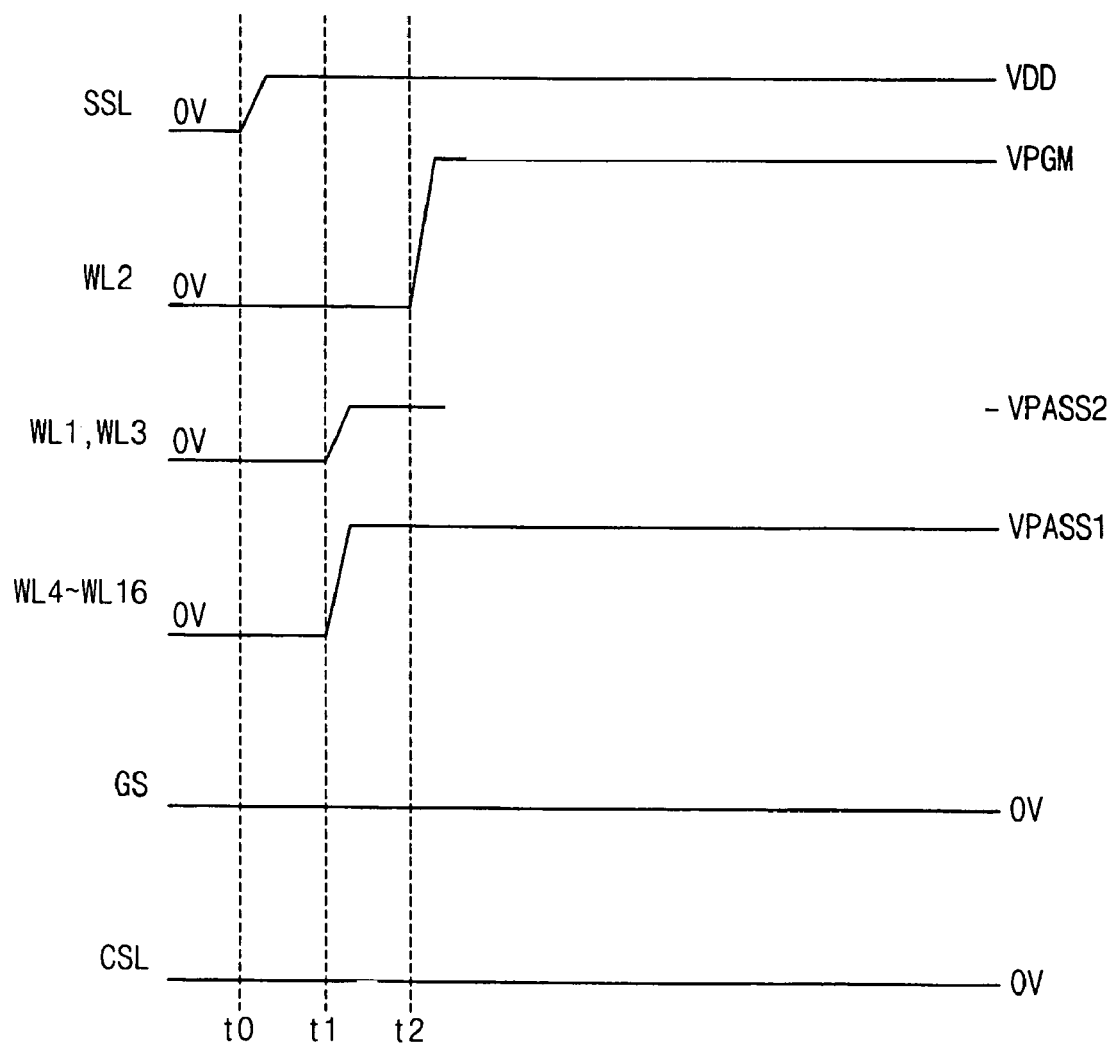
FIG. 4 is a timing diagram illustrating operation of the conventional NAND-type flash memory device shown in FIG. 3.

Example embodiments will be described more fully with reference to the accompanying drawings, in which example embodiments are shown. The present invention may, however, be embodied in many different forms and should not be construed as limited to the example embodiments set forth herein. Rather, these example embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "neighboring," versus "directly neighboring," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
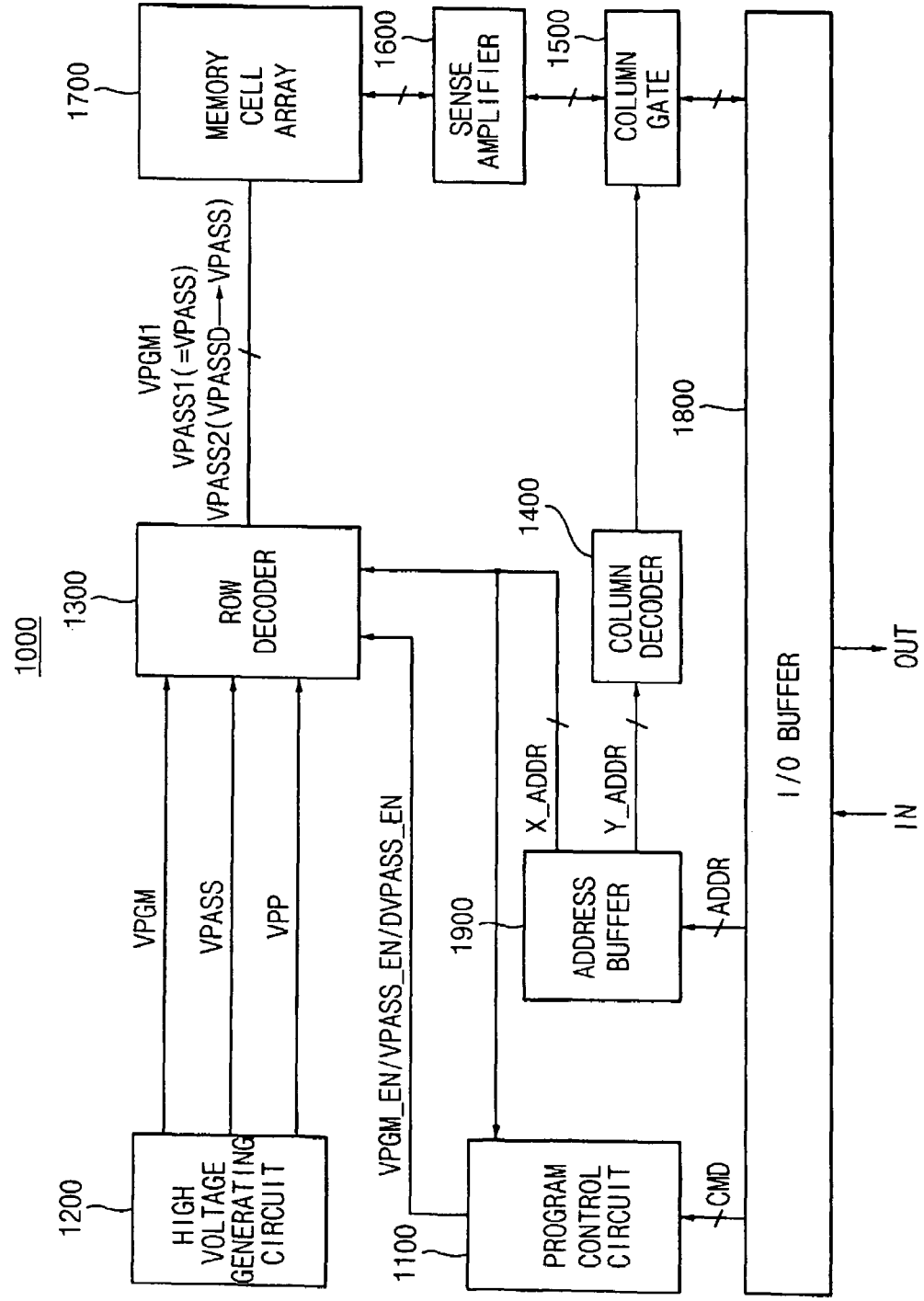
FIG. 5 is a circuit diagram illustrating a NAND-type flash memory device, according to an example embodiment.

FIG. 5 is a circuit diagram illustrating a NAND-type flash memory device, according to an example embodiment.

Referring to FIG. 5, a NAND-type flash memory device 1000 may include a program control circuit 1100, a voltage generating circuit (e.g., a high voltage generating circuit) 1200, a row decoder 1300 and/or a memory cell array 1700.

The memory cell array 1700 may include a plurality of memory transistors. The voltage generating circuit 1200 may generate a program voltage signal VPGM, a pass voltage signal VPASS and/or a boost voltage VPP. The program control circuit 1100 may generate a program voltage enable signal VPGM_EN, a pass voltage enable signal VPASS_EN and/or a reduced pass voltage enable signal DVPASS_EN in response to a command signal CMD and a row address signal X_ADDR. The row decoder 1300 may generate a first program voltage signal VPGM1, a first pass voltage signal VPASS1 and/or a second pass voltage signal VPASS2. The first program voltage signal VPGM1 may transition to a voltage level of the program voltage signal VPGM in response to the program voltage enable signal VPGM_EN. The first pass voltage signal VPASS1 may transition to a voltage level of the pass voltage signal VPASS in response to the pass voltage enable signal VPASS_EN. The second pass voltage signal VPASS2 may have a voltage level equal or substantially equal to the reduced pass voltage signal VPASSD before the program voltage enable signal VPGM_EN is activated, and may have a voltage level equal or substantially equal to the pass voltage signal VPASS while the program voltage enable signal VPGM_EN is activated. The program voltage signal VPGM1, the first pass voltage signal VPASS1 and/or the second pass voltage signal VPASS2 may be provided to word-lines coupled to the memory cell array 1700.

The NAND-type flash memory device 1000 may further include an address buffer 1900, a column decoder 1400, a column gate 1500 and/or a sense amplifier 1600.

The address buffer 1900 may buffer external addresses ADDR to generate row addresses X_ADDR and column addresses Y_ADDR. The column decoder 1400 may decode the column addresses Y_ADDR to generate decoded column addresses. The column gate 1500 may gate first data received from an external source and second data to be output. The sense amplifier 1600 may amplify output data of the memory cell array 1700, and provide the amplified output data to the column gate 1500. Further, the sense amplifier 1600 may receive output data of the column gate 1500 to provide the received output data of the column gate 1500 to the memory cell array 1700.

The NAND-type flash memory device 1000 may include an I/O buffer 1800 that buffers commands CMD, addresses ADDR and/or data received from an external source to be provided to internal circuits, and may buffer data received from internal circuits to be output, for example, externally.

Figure 6:
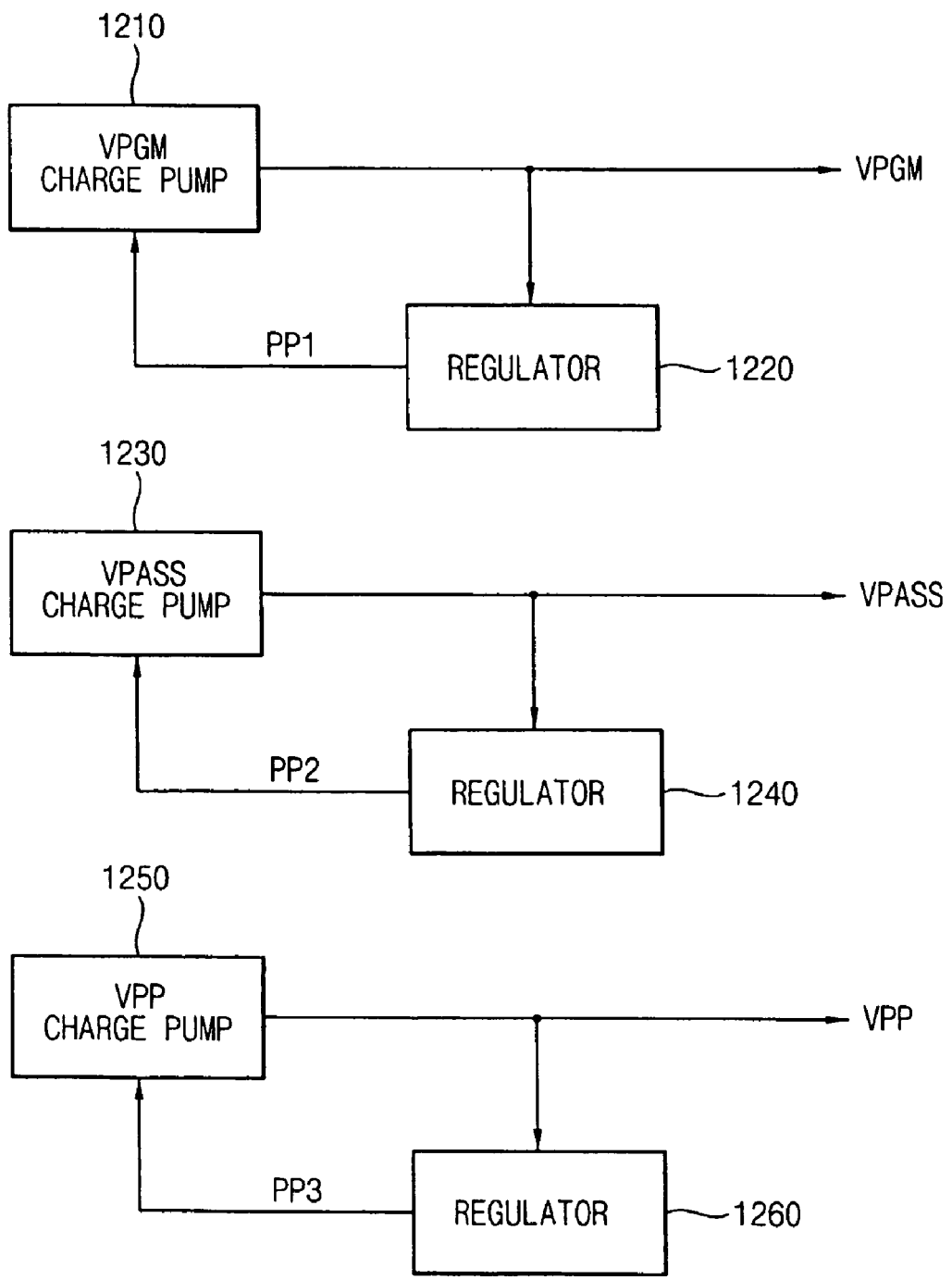
FIG. 6 is a circuit diagram illustrating a voltage generating circuit, according to an example embodiment.

FIG. 6 is a circuit diagram illustrating a voltage generating circuit, according to an example embodiment. The voltage generating circuit of FIG. 6 may be used as the voltage generating circuit 1200 included in the NAND-type flash memory device 1000 of FIG. 5.

Referring to FIG. 6, the voltage generating circuit 1200 may include a program voltage charge pump 1210, a first regulator 1220, a pass voltage charge pump 1230, a second regulator 1240, a boost voltage charge pump 1250 and/or a third regulator 1260.

The program voltage charge pump 1210 may generate the program voltage signal VPGM having a more stable voltage level in response to a first pump control signal PP1. The first regulator 1220 may generate the first pump control signal PP1 in response to the program voltage signal VPGM. The pass voltage charge pump 1230 may generate the pass voltage signal VPASS having a more stable voltage level in response to a second pump control signal PP2. The second regulator 1240 may generate the second pump control signal PP2 in response to the pass voltage signal VPASS. The boost voltage charge pump 1250 may generate the boost voltage VPP having a more stable voltage level in response to a third pump control signal PP3. The third regulator 1260 may generate the third pump control signal PP3 in response to the boost voltage VPP.

Figure 7:
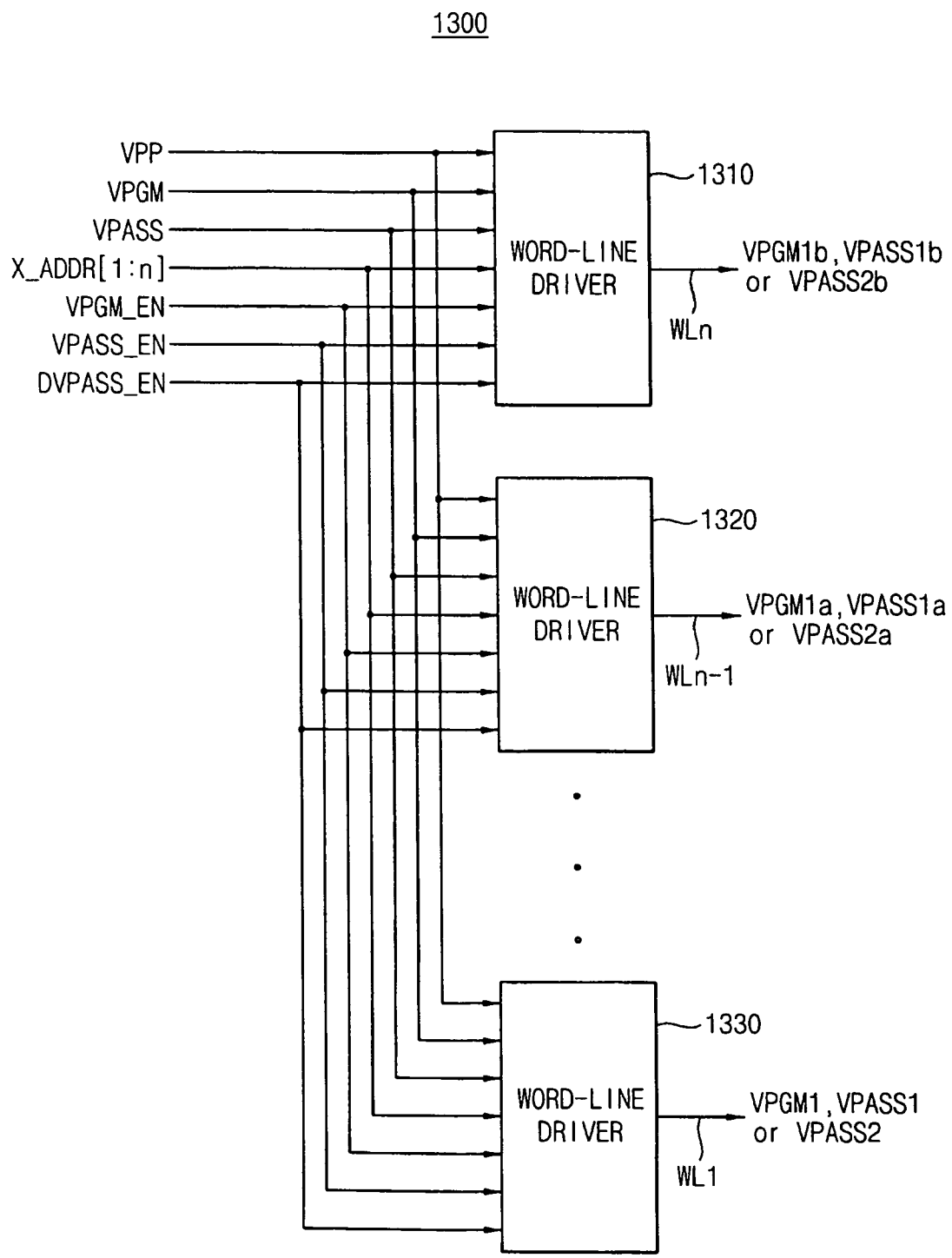
FIG. 7 is a circuit diagram illustrating a row decoder, according to an example embodiment.

FIG. 7 is a circuit diagram illustrating a row decoder, according to an example embodiment. The row decoder of FIG. 7 may be used as the row decoder 1300 included in the NAND-type flash memory device 1000 of FIG. 5.

Referring to FIG. 7, the row decoder 1300 may include a plurality of word-line drivers 1310, 1320 and/or 1330.

The word-line driver 1330 may selectively transfer the program voltage signal VPGM1, the pass voltage signal VPASS1 or the pass voltage signal VPASS2 to word-lines based on the boost voltage VPP, the program voltage signal VPGM, the pass voltage signal VPASS, one bit of the row address signal X_ADDR<1:n>, the program voltage enable signal VPGM_EN, the pass voltage enable signal VPASS_EN and/or the reduced pass voltage enable signal DVPASS_EN.

The word-line driver 1320 may selectively transfer the program voltage signal VPGM1a, the pass voltage signal VPASS1a or the pass voltage signal VPASS2a to word-lines based on the boost voltage VPP, the program voltage signal VPGM, the pass voltage signal VPASS, one bit of the row address signal X_ADDR<1:n>, the program voltage enable signal VPGM_EN, the pass voltage enable signal VPASS_EN and/or the reduced pass voltage enable signal DVPASS_EN.

The word-line driver 1310 may selectively transfer the program voltage signal VPGM1b, the pass voltage signal VPASS1b or the pass voltage signal VPASS2b to word-lines based on the boost voltage VPP, the program voltage signal VPGM, the pass voltage signal VPASS, one bit of the row address signal X_ADDR<1:n>, the program voltage enable signal VPGM_EN, the pass voltage enable signal VPASS_EN and/or the reduced pass voltage enable signal DVPASS_EN.

Figure 8:
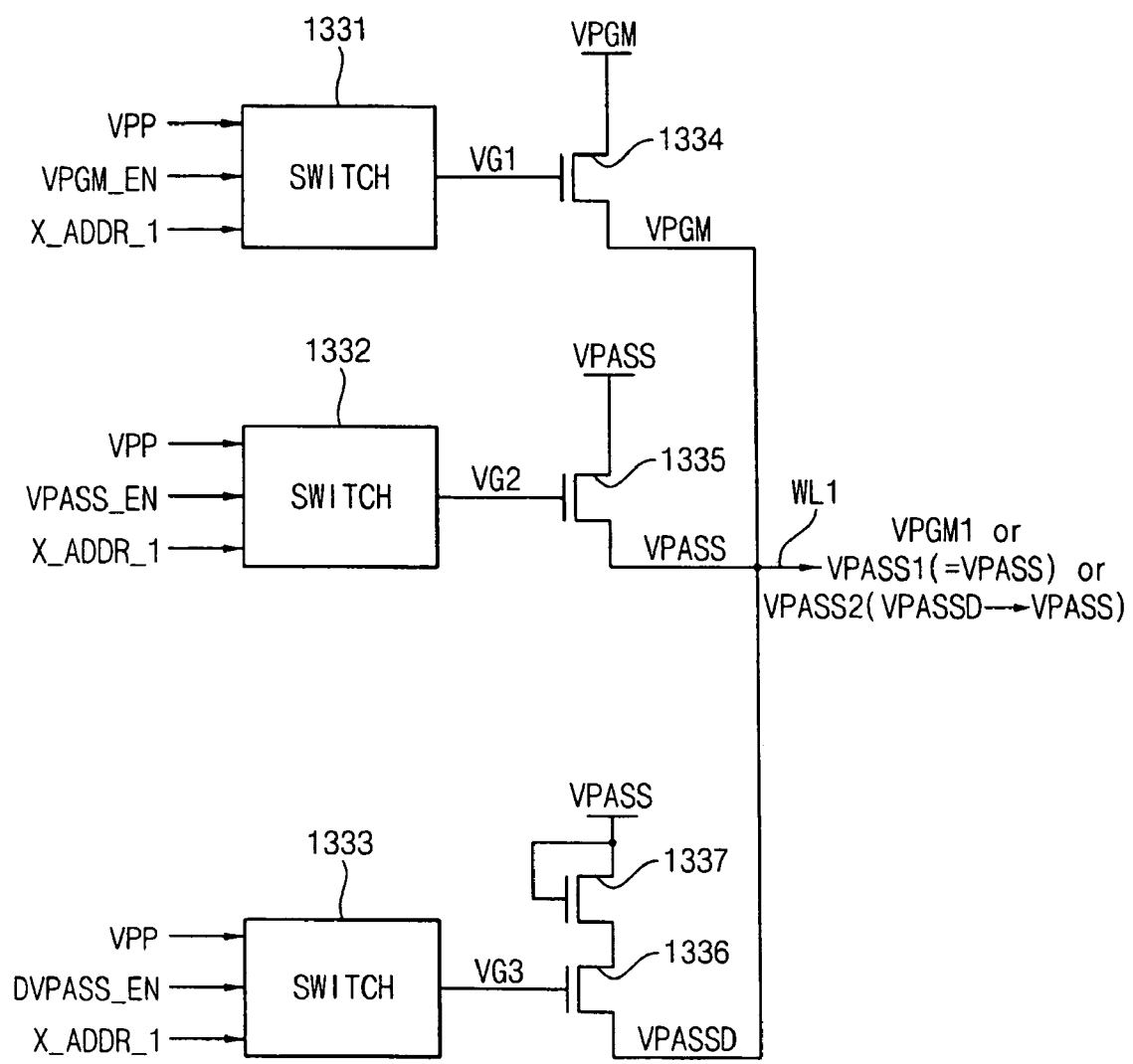
FIG. 8 is a circuit diagram illustrating a word-line driver, according to an example embodiment.

FIG. 8 is a circuit diagram illustrating a word-line driver, according to an example embodiment. The word-line driver of FIG. 8 may be used as the word-line driver 1330 included in the row decoder 1300 of FIG. 7.

Referring to FIG. 8, the word-line driver 1330 may include a plurality of switches 1331, 1332 and 1333, and a plurality of transistors (e.g., NMOS transistors) 1334, 1335, 1336 and 1337.

The switch 1331 may generate a first gate control signal VG1 in response to the boost voltage VPP, the program voltage enable signal VPGM_EN and/or the first bit X_ADDR_1 of the row address signal. The NMOS transistor 1334 may output the program voltage signal VPGM to a word-line WL1 corresponding to the first bit X_ADDR_1 of the row address signal in response to the first gate control signal VG1.

The switch 1332 may generate a second gate control signal VG2 in response to the boost voltage VPP, the pass voltage enable signal VPASS_EN and/or the first bit X_ADDR_1 of the row address signal. The NMOS transistor 1335 may output the pass voltage signal VPASS to a word-line WL1 corresponding to the first bit X_ADDR_1 of the row address signal in response to the second gate control signal VG2.

The switch 1333 may generate a third gate control signal VG3 in response to the boost voltage VPP, the reduced pass voltage enable signal DVPASS_EN and/or the first bit X_ADDR_1 of the row address signal.

The pass voltage signal VPASS may be applied to a drain of the NMOS transistor 1337, and a gate of the NMOS transistor 1337 may be coupled to the drain. The third gate control signal VG3 may be applied to a gate of the NMOS transistor 1336, and a drain of the NMOS transistor 1336 may be coupled to a source of the NMOS transistor 1337. The source of the NMOS transistor 1336 may be coupled to the word-line WL1 corresponding to the first bit X_ADDR_1 of the row address signal. The NMOS transistor 1336 may output the reduced pass voltage signal VPASSD to the word-line WL1 corresponding to the first bit X_ADDR_1 of the row address signal in response to the third gate control signal VG3.

In the word-line driver 1330 shown in FIG. 8, the first program voltage signal VPGM1 corresponds to the program voltage signal VPGM, the first pass voltage signal VPASS1 corresponds to the pass voltage signal VPASS. The second pass voltage signal VPASS2 may transition to a voltage level of the reduced pass voltage signal VPASSD in response to the reduced pass voltage enable signal DVPASS_EN. After a determined time (e.g., a first time period), the second pass voltage signal VPASS2 may transition to a voltage level of the pass voltage signal VPASS in response to the pass voltage enable signal VPASS_EN.

Figure 9:
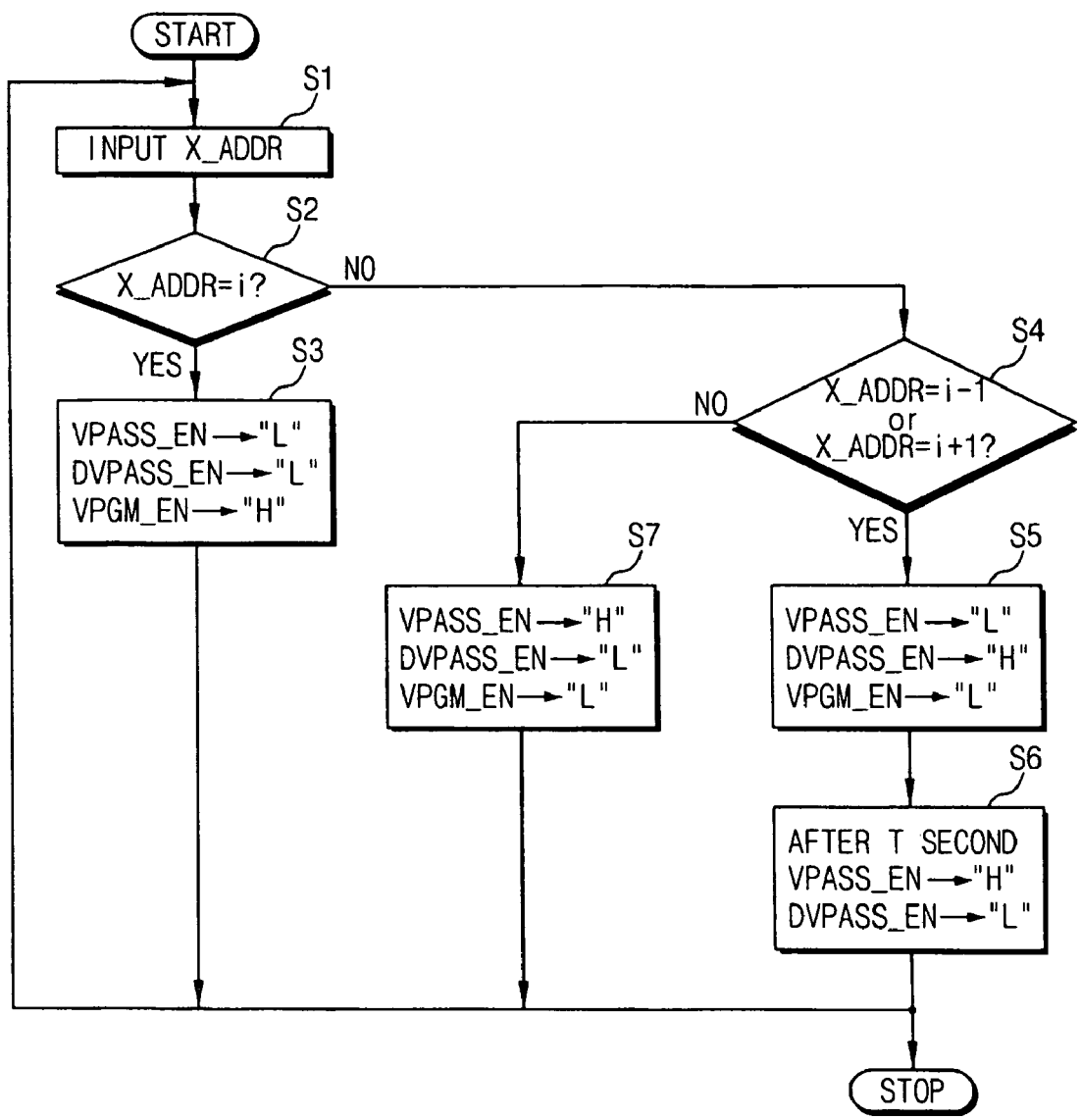
FIG. 9 is a flow chart illustrating an example operation of a program control circuit, according to an example embodiment.

FIG. 9 is a flow chart illustrating an example of operation of a program control circuit, according to an example embodiment. The program control circuit 1100 included in the NAND-type flash memory device 1000 of FIG. 5 may operate according to the operating method shown in FIG. 9.

Referring to the flow chart shown in FIG. 9, at S1 a row address X_ADDR may be input to the program control circuit. At S2, the program control circuit may determine whether the row address X_ADDR is "i". For example, the program control circuit may determine whether the row address X_ADDR corresponds to a selected word-line coupled to a selected memory transistor to be programmed. If the row address X_ADDR is "i" at S2, for example, if the row address X_ADDR corresponds to a selected word-line, the pass voltage enable signal VPASS_EN and the reduced pass voltage enable signal DVPASS_EN may be disabled, while the program voltage enable signal VPGM_EN may be enabled at S3. The pass voltage enable signal VPASS_EN and the reduced pass voltage enable signal DVPASS_EN may be disabled by transitioning the signals to a logic low. On the other hand, the program voltage enable signal VPGM_EN may be enabled by setting the signal to a logic high.

Returning to S2, if the row address X_ADDR is not "i", the program control circuit may determine whether the row address X_ADDR is "i+1" or "i−1" at S4. If the row address X_ADDR is not "i+1" nor "i−1" at S4, for example, if the row address X_ADDR is not adjacent to or directly neighboring a selected word-line, the pass voltage enable signal VPASS_EN may be enabled (e.g., by setting the signal to a logic high), while the reduced pass voltage enable signal DVPASS_EN and the program voltage enable signal VPGM_EN may be disabled (e.g., by setting the signals to a logic low) at S7.

Returning to S4, if the row address X_ADDR is "i+1" or "i−1", for example, if the row address X_ADDR neighbors a selected word-line, the pass voltage enable signal VPASS_EN and the program voltage enable signal VPGM_EN may be disabled, while the reduced pass voltage enable signal DVPASS_EN may be enabled at S5. After a determined time (e.g., a second time period) T, the pass voltage enable signal VPASS_EN may be enabled, while the reduced pass voltage enable signal DVPASS_EN may be disabled at S6.

Control signals to be provided to word-lines coupled to the memory cell array may be determined by iterating the above-discussed process for a plurality of row addresses.

Figure 10A:
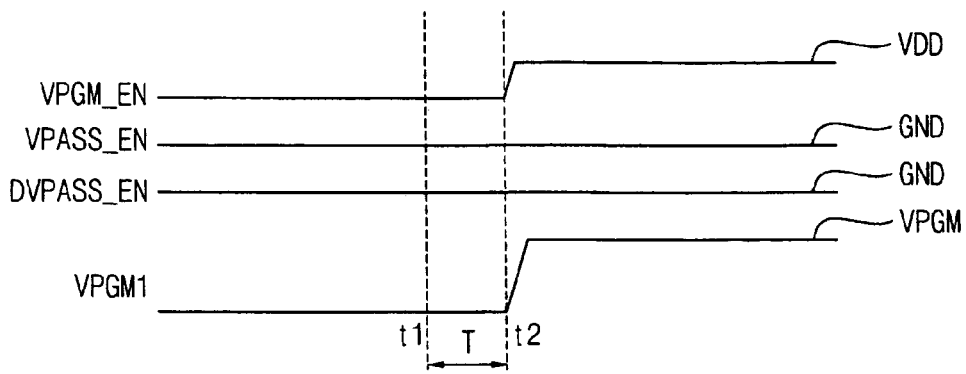
FIG. 10A to FIG. 10C are timing diagrams illustrating waveforms of program voltage signals and pass voltage signals provided to word-lines when program control circuit operates as shown in FIG. 9.
Figure 10B:
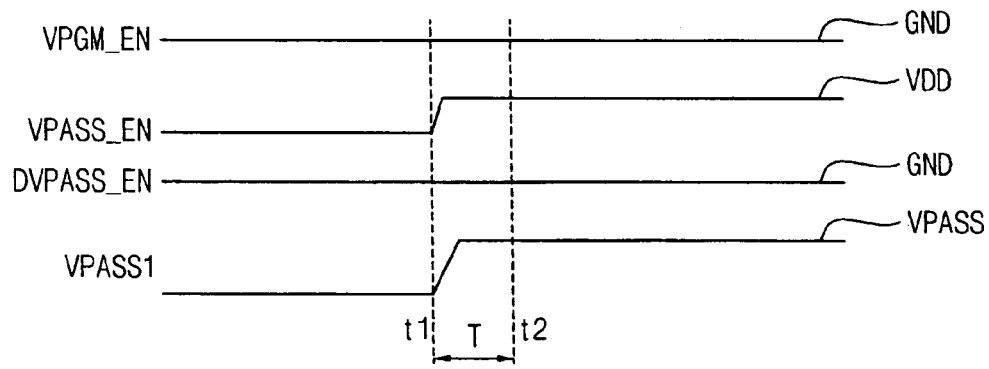
Figure 10C:
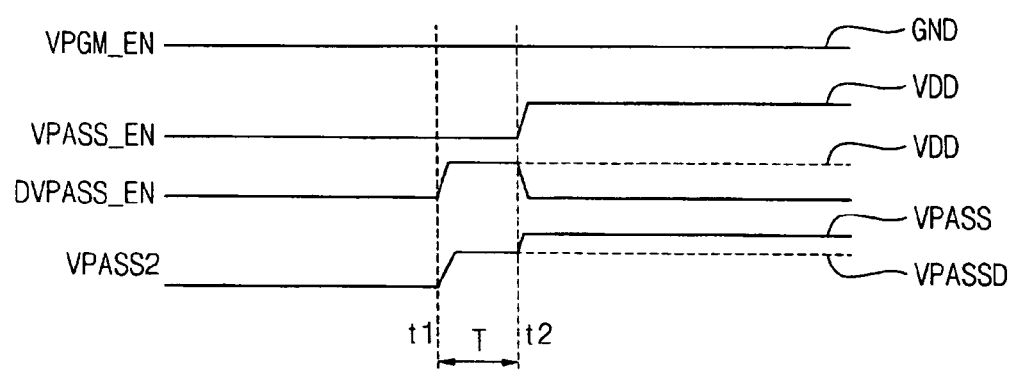

FIG. 10A to FIG. 10C are timing diagrams illustrating example waveforms of program voltage signals and pass voltage signals provided to word-lines when performing the operating method shown in FIG. 9.

FIG. 10A illustrates waveforms of the program control signals VPGM_EN, VPASS_EN and DVPASS_EN when the first program voltage signal VPGM1 is activated to be provided to a selected word-line. FIG. 10B illustrates waveforms of the program control signals VPGM_EN, VPASS_EN and DVPASS_EN when the first pass voltage signal VPASS1 is activated to be provided to an unselected word-line that does not neighbor (e.g., directly neighbor) the selected word-line. FIG. 10C illustrates waveforms of the program control signals VPGM_EN, VPASS_EN and DVPASS_EN when the second pass voltage signal VPASS2 is activated to be provided to an unselected word-line that neighbors (e.g., directly neighbors) the selected word-line.

Referring to FIG. 10A and FIG. 10B, the first program voltage signal VPGM1 may be activated at time t2 in response to the program voltage enable signal VPGM_EN, and the first pass voltage signal VPASS1 may be activated at time t1 in response to the pass voltage enable signal VPASS_EN. Referring to FIG. 10C, the second pass voltage signal VPASS2 may transition at time t1 to a voltage level of the reduced pass voltage signal VPASSD in response to the reduced pass voltage enable signal DVPASS_EN. After a determined time (e.g., a third time period) T, the second pass voltage signal VPASS2 may transition at time t2 to a voltage level of the pass voltage signal VPASS in response to the pass voltage enable signal VPASS_EN.

Figure 11:
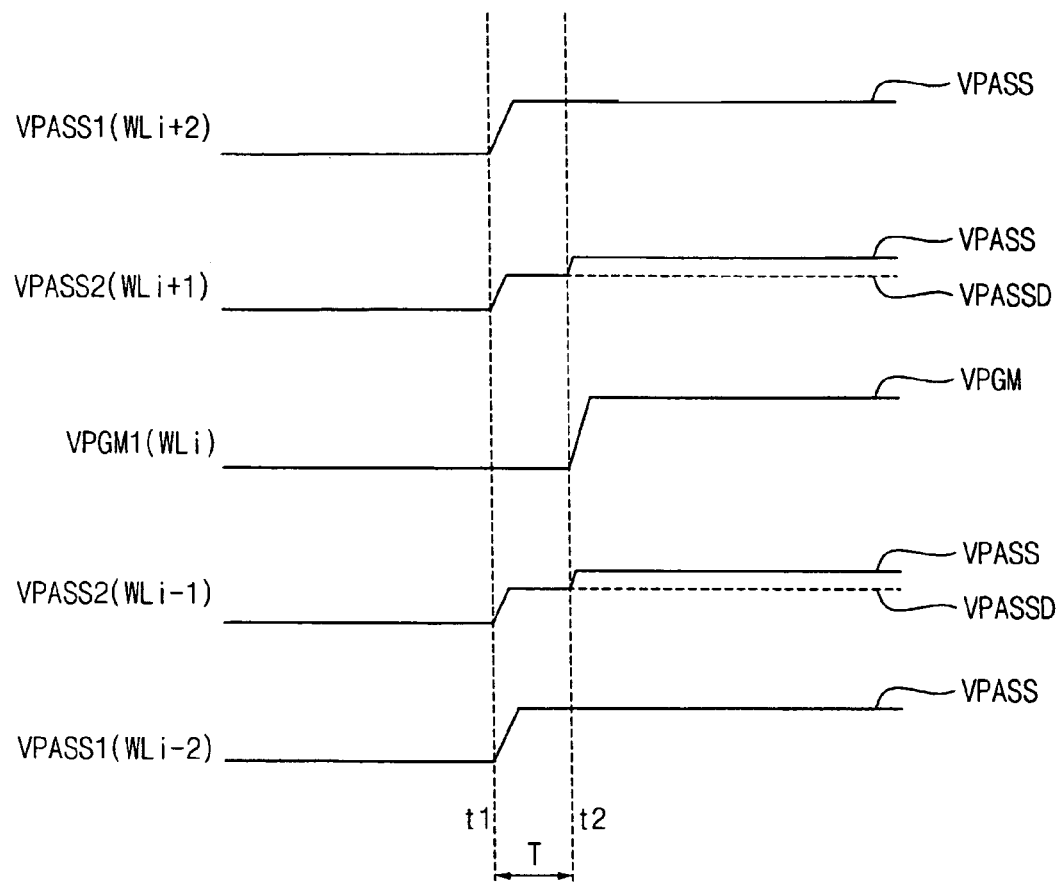
FIG. 11 is a timing diagram illustrating an example operation of the NAND-type flash memory device shown in FIG. 5 when the program control circuit operates as shown in FIG. 9.

FIG. 11 is a timing diagram illustrating example operation of a NAND-type flash memory device, according to an example embodiment. The NAND-type flash memory device 1000 of FIG. 5 may operate in the manner described by FIG. 11, for example, when the program control circuit 1100 operates according to a method illustrated in the flow chart of FIG. 9.

Referring to FIG. 11, the first program voltage signal VPGM1 may be applied to the selected word-line WLi coupled to a selected memory transistor to be programmed. The second pass voltage signal VPASS2 may be applied to the unselected word-lines WLi+1 and WLi−1 adjacent to or directly neighboring the selected word-line WLi, and the first pass voltage signal VPASS1 may be applied to the unselected word-line WLi+2 and WLi−2 not adjacent to or directly neighboring the selected word-line WLi.

Figure 12:
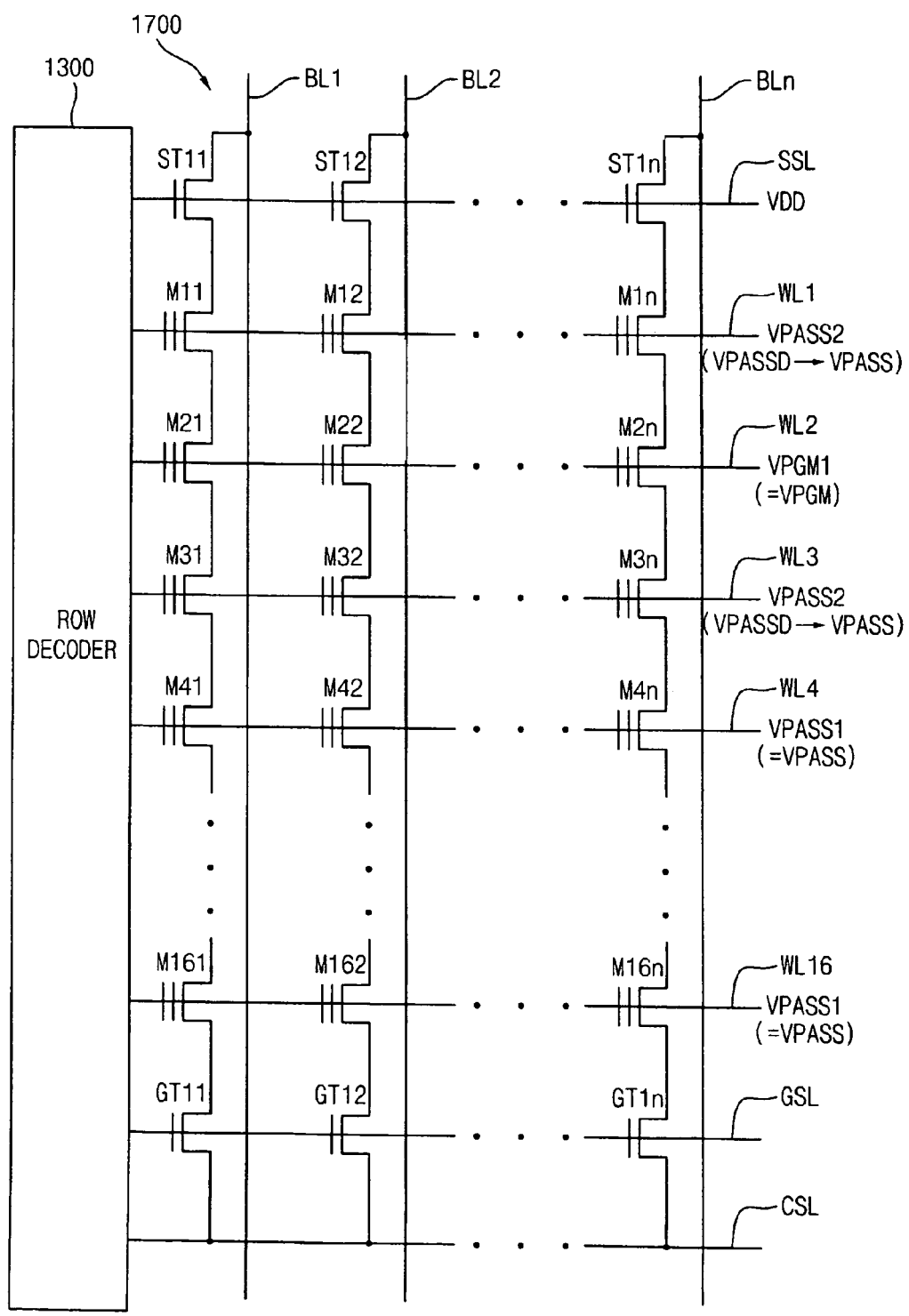
FIG. 12 is a circuit diagram illustrating voltage signals of word-lines coupled to a memory cell array included in the NAND-type flash memory device shown in FIG. 5 when the program control circuit operates as shown in FIG. 9.

FIG. 12 is a circuit diagram illustrating voltage signals of word-lines coupled to a memory cell array, according to an example embodiment, for example, included in a memory device operating according to a method illustrated in the flow chart of FIG. 9. The memory cell array shown in FIG. 12 is a memory block including memory transistors M1 to M16$n$ coupled to 16 word-lines and n bit-lines BL1 to BLn, and may be used as the memory cell array 1700 included in the NAND-type flash memory device 1000 of FIG. 5.

Figure 13:
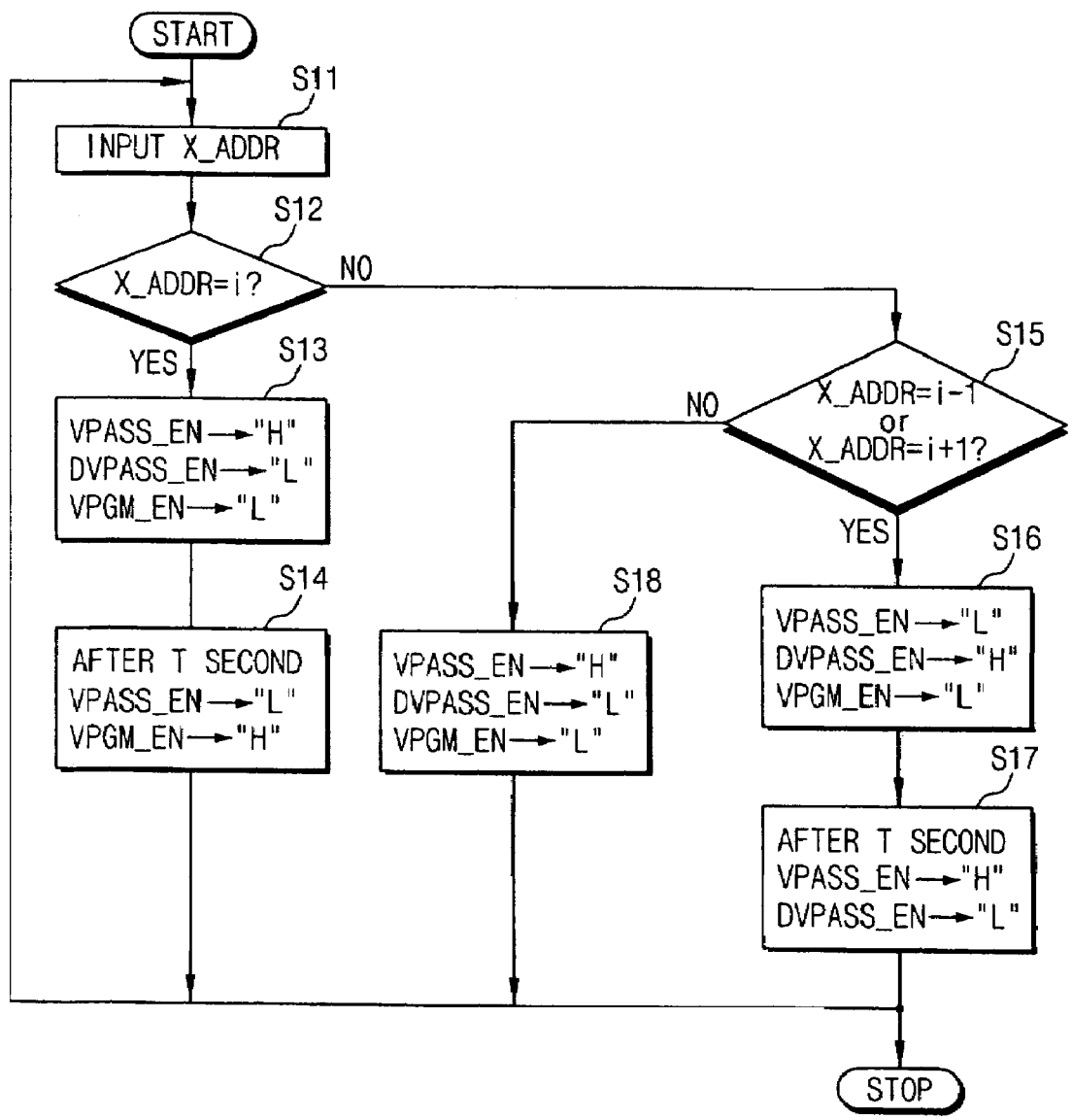
FIG. 13 is a flow chart illustrating another example operation of a program control circuit, according to an example embodiment.

FIG. 13 is a flow chart illustrating another example of operation of a program control circuit, according to an example embodiment. The program control circuit 1100 included in the NAND-type flash memory device 1000 shown in FIG. 5 may operate according to the operating method shown in FIG. 13.

Referring to the flow chart shown in FIG. 13, at S11 a row address X_ADDR may be input to the program control circuit. At S12, the program control circuit may determine whether the row address X_ADDR is "i". For example, the program control circuit may determine whether the row address X_ADDR corresponds to a selected word-line coupled to a selected memory transistor to be programmed. If the row address X_ADDR is "i" (e.g., if the row address X_ADDR corresponds to a selected word-line), the pass voltage enable signal VPASS_EN may be enabled, and the reduced pass voltage enable signal DVPASS_EN and the program voltage enable signal VPGM_EN may be disabled at S13. After a determined time T, the pass voltage enable signal VPASS_EN may b enabled and the program voltage enable signal VPGM_EN may be enabled at S14.

Returning to S12, if the row address X_ADDR is not "i", the program control circuit may determine whether the row address X_ADDR is "i+1" or "i−1" at S15. If the row address X_ADDR is neither "i+1" nor "i−i" (e.g., if the row address X_ADDR does not neighbor, for example, directly neighbor a selected word-line), the pass voltage enable signal VPASS_EN may be enabled, and the reduced pass voltage enable signal DVPASS_EN and the program voltage enable signal VPGM_EN may be disabled at S18.

Returning to S15, if the row address X_ADDR is "i+1" or "i−1" (e.g., if the row address X_ADDR neighbors, for example, directly neighbors a selected word-line, the reduced pass voltage enable signal DVPASS_EN and the pass voltage enable signal VPASS_EN may be enabled, while the program voltage enable signal VPGM_EN may be disabled at S16. After a determined time T, the pass voltage enable signal VPASS_EN may be enabled and the reduced pass voltage enable signal DVPASS_EN may be disabled at S17.

Control signals to be provided to word-lines coupled to the memory cell array may be determined by iterating the aforementioned process for a plurality of row addresses.

Figure 14A:
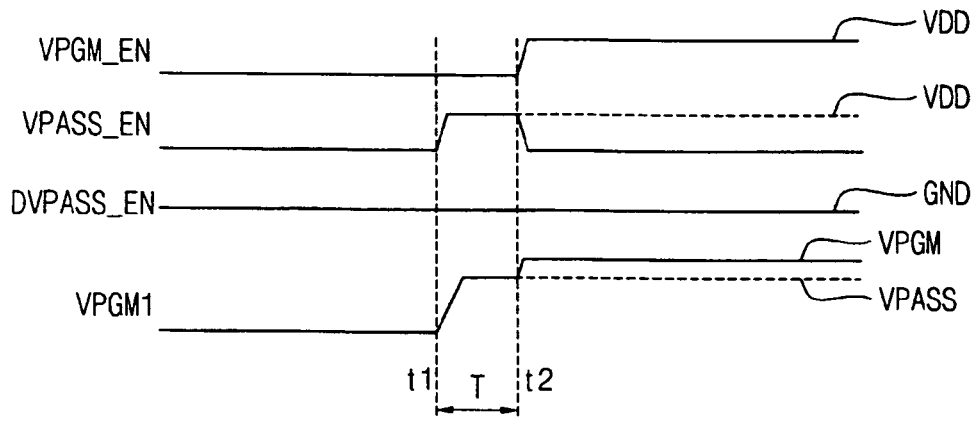
FIG. 14A to FIG. 14C are timing diagrams illustrating waveforms of program voltage signals and pass voltage signals provided to word-lines when the program control circuit operates as shown in FIG. 13.
Figure 14B:
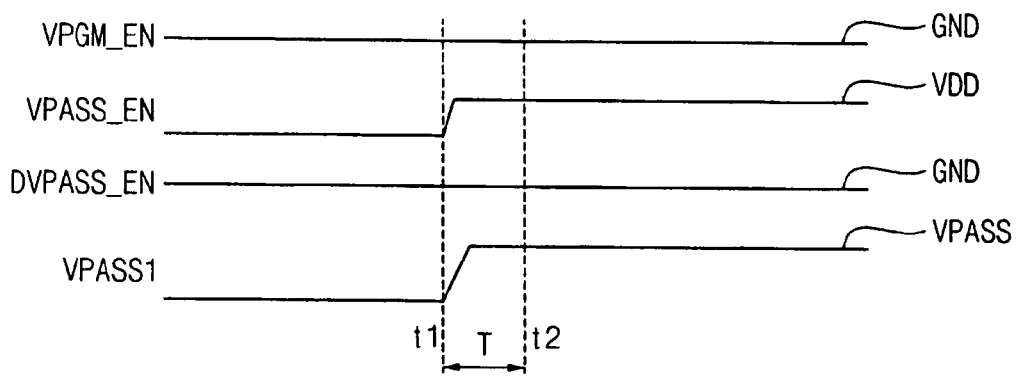
Figure 14C:
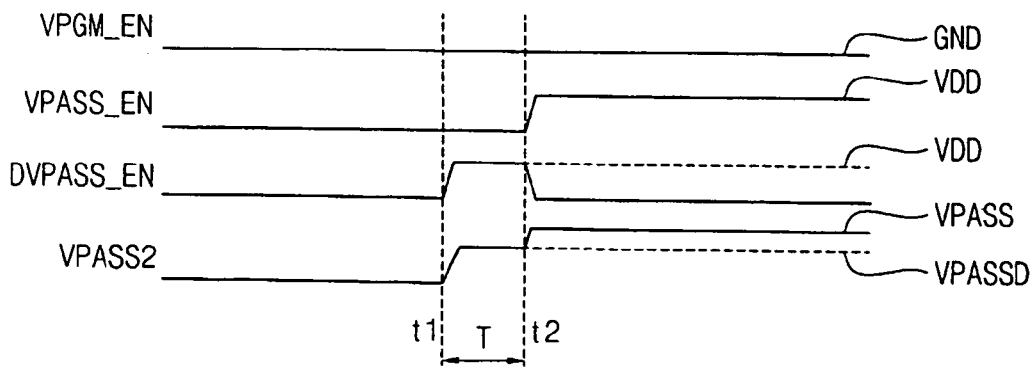

FIG. 14A to FIG. 14C are timing diagrams illustrating waveforms of program voltage signals and pass voltage signals provided to word-lines when programming is performed according to the flow chart of FIG. 13.

FIG. 14A illustrates waveforms of program control signals VPGM_EN, VPASS_EN and DVPASS_EN when the first program voltage signal VPGM1 is activated to be provided to a selected word-line. FIG. 14B illustrates waveforms of the program control signals VPGM_EN, VPASS_EN and DVPASS_EN when the first pass voltage signal VPASS1 is activated to be provided to an unselected word-line not adjacent to or directly neighboring the selected word-line. FIG. 14C illustrates waveforms of the program control signals VPGM_EN, VPASS_EN and DVPASS_EN when the second pass voltage signal VPASS2 is activated to be provided to an unselected word-line that is adjacent to or directly neighboring the selected word-line.

Referring to FIG. 14A, the first program voltage signal VPGM1 makes transition to a voltage level of the pass voltage signal VPASS in response to the pass voltage enable signal VPASS_EN. After a determined time T, the first program voltage signal VPGM1 may transition at time t2 to a voltage level of the program voltage signal VPGM in response to the program voltage enable signal VPGM_EN. Referring to FIG. 14B, the first pass voltage signal VPASS1 may be activated at time t1 in response to the pass voltage enable signal VPASS_EN. Referring to FIG. 14C, the second pass voltage signal VPASS2 may transition at time t1 to a voltage level of the reduced pass voltage signal VPASSD in response to the reduced pass voltage enable signal DVPASS_EN. After a determined time T, the second pass voltage signal VPASS2 may transition at time t2 to a voltage level of the pass voltage signal VPASS in response to the pass voltage enable signal VPASS_EN.

Figure 15:
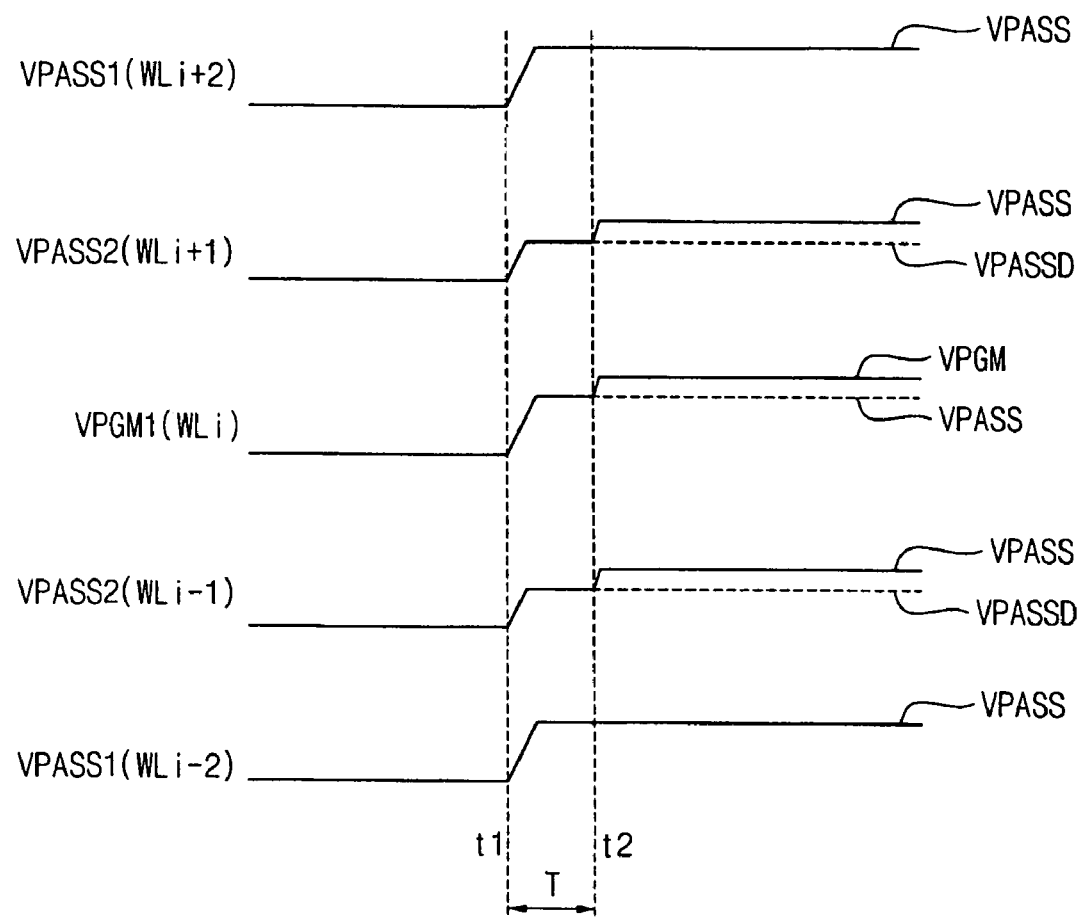
FIG. 15 is a timing diagram illustrating an example operation of the NAND-type flash memory device shown in FIG. 5 when the program control circuit operates as shown in FIG. 13.

FIG. 15 is a timing diagram illustrating operation of the NAND-type flash memory device 1000 shown in FIG. 5 when the program control circuit 1100 operates according to a method illustrated in the flow chart of FIG. 13.

Referring to FIG. 15, the first program voltage signal VPGM1 may be applied to the selected word-line WLi coupled to a selected memory transistor to be programmed. The second pass voltage signal VPASS2 is applied to the unselected word-line WLi+1 and WLi−1 adjacent to or directly neighboring the selected word-line WLi, and the first pass voltage signal VPASS1 may be applied to the unselected word-line WLi+2 and WLi−2 not adjacent to or directly neighboring the selected word-line WLi.

Figure 16:
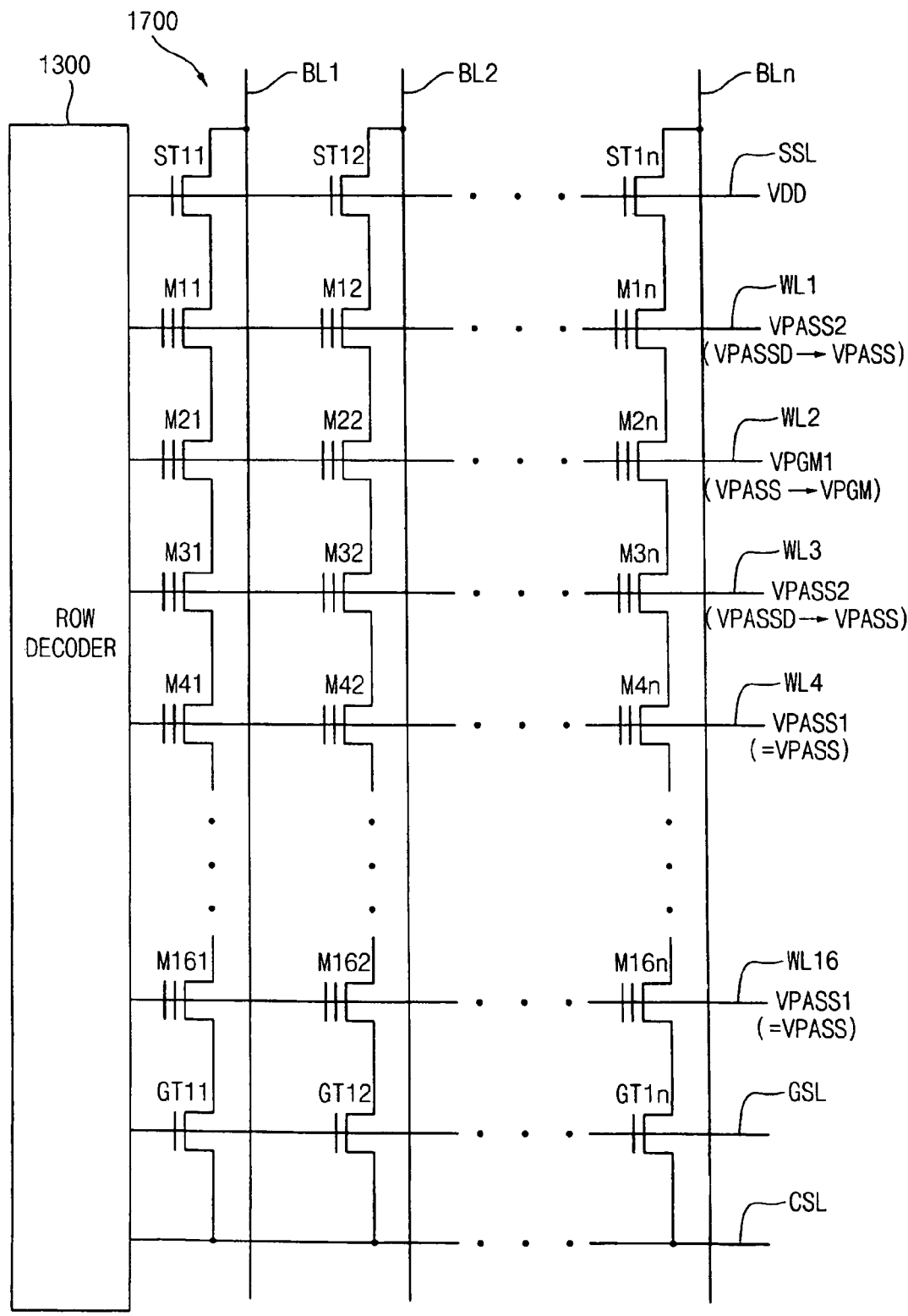
FIG. 16 is a circuit diagram illustrating voltage signals of word-lines coupled to a memory cell array included in the NAND-type flash memory device shown in FIG. 5 when the program control circuit operates as shown in FIG. 13.

FIG. 16 is a circuit diagram illustrating voltage signals of word-lines coupled to a memory cell array 1700 included in the NAND-type flash memory device 1000 shown in FIG. 5 when the memory device operates according to the method illustrated in the flow chart of FIG. 13. The memory cell array 1700 shown in FIG. 16 is a memory block including memory transistors M1 to M16*n* coupled to 16 word-lines and n bit-lines BL1 to BLn.

Hereinafter, the operation of a NAND-type flash memory device, according to an example embodiment, will be discussed with regard to FIGS. 5 and 16.

Referring to FIG. 16, a first selection line SSL, a second selection line GSL, word lines WL1 to WL16 and a common source line CSL may be coupled to row decoder 1300. The memory cell array 1700 may include selection transistors ST11 to ST1*n* and GT11 to GT1*n*, and memory transistors M11 to M16*n*. The selection transistor ST11, the memory transistors M11 to M161 and the selection transistor GT11 are coupled to the bit-line BL1. The selection transistor ST12, the memory transistors M12 to M162 and the selection transistor GT12 may be coupled to the bit-line BL2. The selection transistor ST1*n*, the memory transistors M1*n* to M16*n* and the selection transistor GT1*n* may be coupled to the bit line BLn. The ground voltage may be applied to the common source line CSL. The first program voltage signal VPGM1 may be applied to a selected word-line WLi coupled to selected memory transistors. The second pass voltage signal VPASS2 may be applied to the unselected word-line WLi+1 and WLi−1 adjacent to or directly neighboring the selected word-line WLi, and the first pass voltage signal VPASS1 may be applied to the unselected word-line WLi+2 and WLi−2 not adjacent to or directly neighboring to the selected word-line WLi.

If programming is performed for the memory transistors M21 to M2*n* coupled to the word-line WL2, the operation of the memory cell array shown in FIG. 16 is as follows. Further, among the memory transistors M21 to M2*n*, M21 is assumed to be programmed to data "1" and M2*n* is assumed to be programmed to data "0".

Programming is a process of injecting electrons into the floating gate of a memory transistor. Erase is a process of pushing the electrons stored in the floating gate into the surface of a channel, and the threshold voltage (VTH) is decreased when the erase operation is completed. The threshold voltage (VTH) is increased when data "0" is programmed, and the threshold voltage (VTH) of erased state is maintained when data "0" is programmed.

Data "1" and data "0" are applied to the bit-lines BL1 and BLn before programming is started. A bit-line coupled to a memory transistor programmed to data "1", which maintains erased data, may be referred to as an unselected bit-line, and a bit-line coupled to a memory transistor programmed to data "0", in which data is changed, may be referred to as a selected bit-line.

During a program operation, according to at least some example embodiments, a supply voltage VDD corresponding to data "1" may be applied to the bit-line BL1, and a ground voltage corresponding to data "0" may be applied to the bit-line BLn. The supply voltage VDD may be applied to the first selection line SSL, and a voltage of 0 may be applied to the second selection line GSL to turn off selection transistors GT11 to GT1n. The first program voltage signal VPGM1 may be applied to the selected word-line WL2. The second pass voltage signal VPASS2 may be applied to the unselected word-line WL1 and WL3 that neighbor (e.g., directly neighbor) the selected word-line WL2, and the first pass voltage signal VPASS1 may be applied to the unselected word-line WL4 to WL6 not adjacent to or directly neighboring the selected word-line WL2. At time t2, the first program voltage signal VPGM1 may transition to a voltage level of the program voltage signal VPGM in response to the program voltage enable signal VPGM_EN, as shown in FIG. 10A. At time t1, the first pass voltage signal VPASS1 may transition to a voltage level of the pass voltage signal VPASS in response to the pass voltage enable signal VPASS_EN, as shown in FIG. 10B. At time t1, the second pass voltage signal VPASS2 may transition to a voltage level of the reduced pass voltage signal VPASSD in response to the reduced pass voltage enable signal DVPASS_EN, and the second pass voltage signal VPASS2 may transition, at time t2 after a determined time T from time t1, to a voltage level of the pass voltage signal VPASS in response to the pass voltage enable signal VPASS_EN, as shown in FIG. 10C.

The supply voltage VDD may be applied to the selection transistor ST1n and a voltage corresponding to data "0" (e.g., a ground voltage) may be applied to the selected bit-line BLn. As a result, the selection transistor ST1n may be turned on. Further, the first pass voltage signal VPASS1, the second pass voltage signal VPASS2, or the first program voltage signal VPGM1 may be applied to control gates of the memory transistors M1n to M16n coupled to the selected bit-line BLn. In this example, all of the memory transistors M1n to M16n may be turned on, and drain, source and channel of each of the memory transistors M1n to M16n may have a voltage level equal or substantially equal to the ground voltage. The first program voltage signal VPGM1 may be applied to a control gate of the memory transistor M2n coupled to the selected word-line WL2. This results in an electric potential difference, and electrons are injected into the floating gate of the memory transistor M2n, for example, by a tunneling effect. Accordingly, the memory transistor M2n may transition or change into an enhancement-mode transistor having a positive threshold voltage.

The supply voltage VDD corresponding to data "1" may be applied to the unselected bit-line BL1 so that the memory transistor M21 may maintain erased data, for example, data "1". The supply voltage VDD may be applied to the first selection line SSL, and the supply voltage VDD may be applied to a gate and a drain of the selection transistor ST11. The channel of each of the memory transistors M11 to M161 may be charged to a first voltage (VET), which may be higher than VDD-VTH, by capacitance coupling between the memory transistors M11 to M161, when the voltage of the control gate of each of the memory transistors M11 to M161 electrically coupled to a source of the selection transistor ST11 is changed from about 0V to a voltage level of the pass voltage signal VPASS or a voltage level of the program voltage signal VPGM. In at least this example, VTH is a threshold voltage of the selection transistor ST11. When capacitance between a control gate and a channel of each of the memory transistors M11 to M161 is C1, and capacitance between a channel of each of the memory transistors M11 to M161 and P-type well is C2, the coupling coefficient "r" may be expressed as r=C1/(C1+C2). The first voltage VET may be expressed as Equation 1.

$$VET = \frac{(n-1) \times r \times VPASS + r \times VPGM}{n} + (VDD - VTH) \quad \text{[Equation 1]}$$

In Equation 1, n denotes the number of memory transistors included in a NAND cell unit. The NAND cell unit may include selection transistors and memory transistors coupled in series between each of the bit-lines BL1, BL2, and BLn and the common source line CSL.

When the voltage of a channel of the memory transistors M11 to M161 is increased to VDD-VTH, the first selection transistor S11 may be turned off, and thus, a channel of each of the memory transistors M11 to M161 may be charged uniformly or substantially uniformly to the first voltage VET. Therefore, a voltage difference of VET-VPGM between the control gate and the channel of the selection transistor M21 may be reduced. The voltage difference VET-VPGM may not be high enough to generate Fowler-Nordheim tunneling (F-N tunneling). Thus, programming of the selected memory transistor M21 may be suppressed (e.g., prevented and/or prohibited). For example, the selected memory transistor M21 may maintain a negative threshold voltage corresponding to an erased state. As described above, the program of the selected memory transistor M21 coupled to the unselected bit-line BL1 may be automatically suppressed, prohibited and/or prevented.

The row decoder 1300, according to an example embodiment, may provide the second pass voltage signal VPASS2 to the unselected word-line WL1 and WL3 that are adjacent to or directly neighboring the selected word-line WL2, and may provide the first pass voltage signal VPASS1 to the unselected word-line WL4 to WL6 not adjacent to or directly neighboring the selected word-line WL2. As described above, the first pass voltage signal VPASS1 may transition at time t1 to a voltage level of the pass voltage signal VPASS in response to the pass voltage enable signal VPASS_EN. The second pass voltage signal VPASS2 may transition at time t1 to a voltage level of the reduced pass voltage signal VPASSD in response to the reduced pass voltage enable signal DVPASS_EN, and may transition, at time t2 after a determined time T from time t1, to a voltage level of the pass voltage signal VPASS in response to the pass voltage enable signal VPASS_EN.

In the conventional art, while the program voltage signal VPGM is applied to the selected word-line WL2, the voltage of the unselected word-line WL1 and WL3 adjacent to or directly neighboring the selected word-line WL2 may become higher than a level of the pass voltage signal VPASS. Therefore, unwanted programming may be caused by capacitance coupling.

In NAND-type flash memory devices, according to an example embodiment, the voltage signal, which may have a voltage level of the reduced pass voltage signal VPASSD before the program voltage enable signal VPGM_EN is activated and may have a voltage level of the pass voltage signal VPASS while the program voltage enable signal VPGM_EN is activated, may be applied to the unselected word-line WL1 and WL3 adjacent to or directly neighboring the selected word-line WL2.

Accordingly, the NAND-type flash memory device of FIG. 5 may suppress and/or prevent unwanted programming on the unselected word-line by capacitance coupling when the program voltage signal is applied to the selected word-line.

According to a method of programming, according to an example embodiment, as shown in FIG. 13, the first program voltage signal VPGM1 may be increased to a level of pass voltage signal VPASS first, and the first program voltage signal VPGM1 may increase to a level of program voltage signal VPGM when the program voltage enable signal VPGM_EN is activated. When programmed according to a method shown in FIG. 13, unwanted programming on the memory transistors coupled to the unselected word-line by capacitance coupling may be suppressed and/or prevented.

Figure 17:
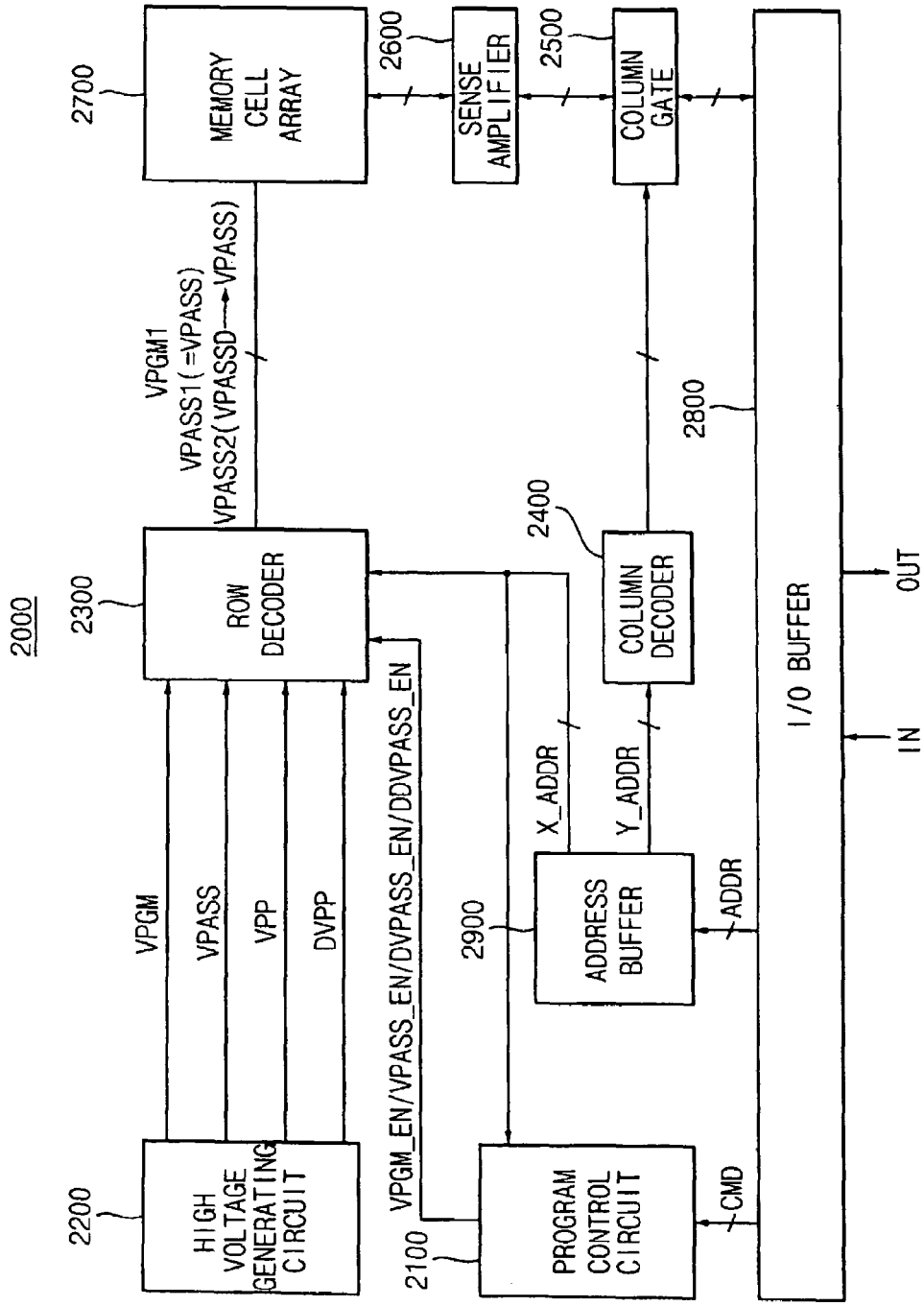
FIG. 17 is a circuit diagram illustrating a NAND-type flash memory device, according to an example embodiment.

FIG. 17 is a circuit diagram illustrating a NAND-type flash memory device, according to another example embodiment.

Referring to FIG. 17, the NAND-type flash memory device 2000 may include a program control circuit 2100, a voltage generating circuit 2200, a row decoder 2300 and/or a memory cell array 2700.

The memory cell array 2700 may include a plurality of memory transistors. The voltage generating circuit 2200 may generate a program voltage signal VPGM, a pass voltage signal VPASS, a first boost voltage VPP and/or a second boost voltage DVPP. The program control circuit 2100 may generate a program voltage enable signal VPGM_EN, a pass voltage enable signal VPASS_EN, a first reduced pass voltage enable signal DVPASS_EN and/or a second reduced pass voltage enable signal DDVPASS_EN in response to a command signal CMD and a row address signal X_ADDR. The row decoder 2300 may generate a first program voltage signal VPGM1, a first pass voltage signal VPASS1 and/or a second pass voltage signal VPASS2. The first program voltage signal VPGM1 may transition to a voltage level of the program voltage signal VPGM in response to the program voltage enable signal VPGM_EN. The first pass voltage signal VPASS1 may transition to a voltage level of the pass voltage signal VPASS in response to the pass voltage enable signal VPASS_EN. The second pass voltage signal VPASS2 may have a voltage level of the reduced pass voltage signal VPASSD before the program voltage enable signal VPGM_EN is activated, and may have a voltage level of the pass voltage signal VPASS while the program voltage enable signal VPGM_EN is activated. The program voltage signal VPGM1, the first pass voltage signal VPASS1, and the second pass voltage signal VPASS2 may be provided to word-lines coupled to the memory cell array 2700.

The NAND-type flash memory device 2000 may further include an address buffer 2900, a column decoder 2400, a column gate 2500 and/or a sense amplifier 2600.

The address buffer 2900 may buffer external addresses ADDR to generate row addresses X_ADDR and column addresses Y_ADDR. The column decoder 2400 may decode the column addresses Y_ADDR to generate decoded column addresses. The column gate 2500 may gate a first data received from external and a second data to be output. The sense amplifier 2600 may amplify output data from the memory cell array 2700 to provide the amplified output data to the column gate 2500. The sense amplifier 2600 may receive output data of the column gate 2500 to provide the received output data of the column gate 2500 to the memory cell array 2700.

The NAND-type flash memory device 2000 may further include an I/O buffer 2800 that buffers commands CMD, addresses ADDR and data received from external to be provided to internal circuits, and may buffer data received from the internal circuits to be output externally.

Figure 18:
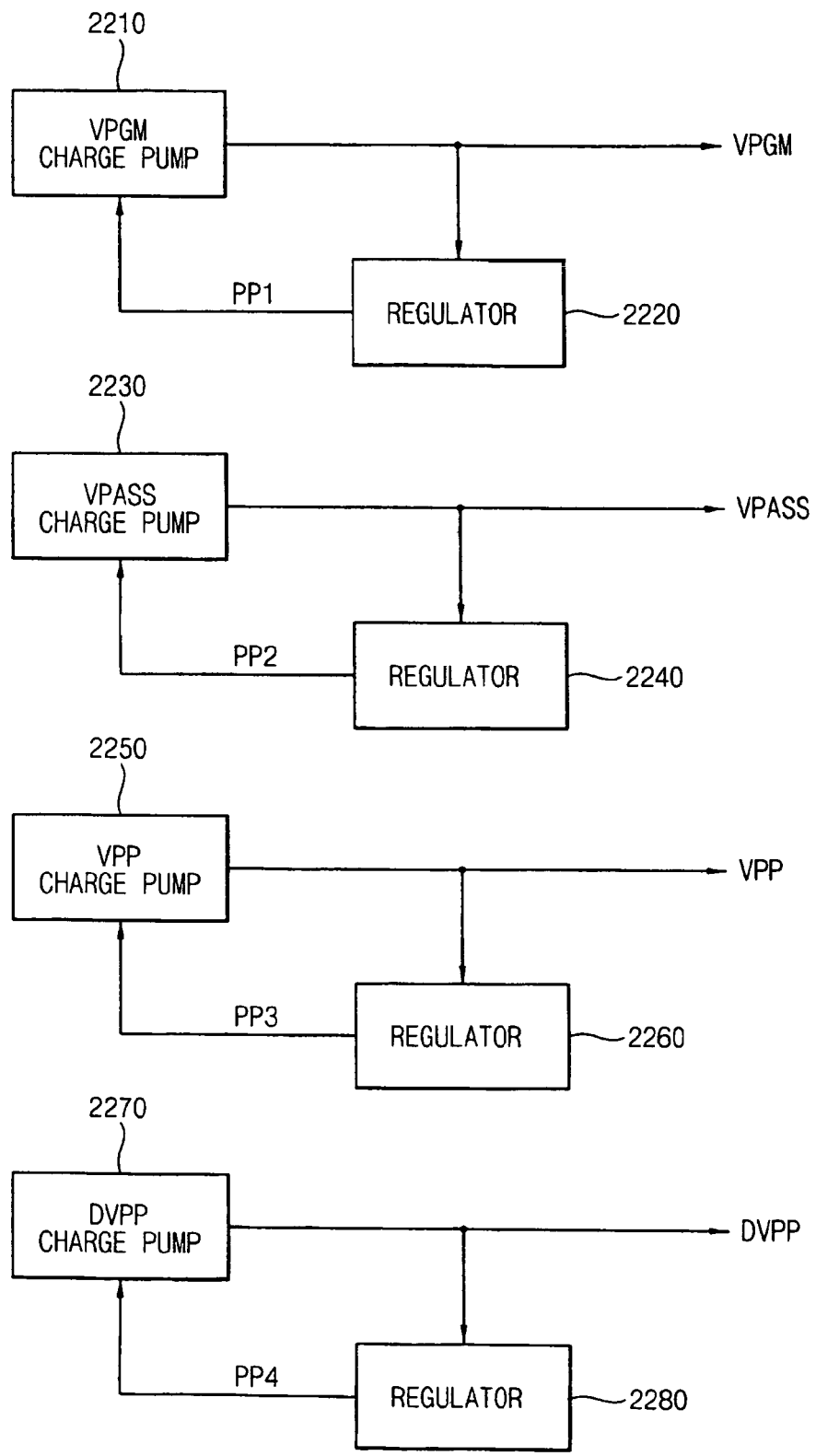
FIG. 18 is a circuit diagram illustrating a voltage generating circuit, according to another example embodiment.

FIG. 18 is a circuit diagram illustrating a voltage generating circuit, according to another example embodiment. The voltage generating circuit, of FIG. 18 may be used as the voltage generating circuit 2200 in the NAND-type flash memory device 2000 shown in FIG. 17.

Referring to FIG. 18, the voltage generating circuit 2200 may include a program voltage charge pump 2210, a first regulator 2220, a pass voltage charge pump 2230, a second regulator 2240, a first boost voltage charge pump 2250, a third regulator 2260, a second boost voltage charge pump 2270 and/or a fourth regulator 2280.

The program voltage charge pump 2210 may generate the program voltage signal VPGM having a more or relatively stable voltage level in response to a first pump control signal PP1. The first regulator 2220 may generate the first pump control signal PP1 in response to the program voltage signal VPGM. The pass voltage charge pump 2230 may generate the pass voltage signal VPASS having a stable voltage level in response to a second pump control signal PP2. The second regulator 2240 may generate the second pump control signal PP2 in response to the pass voltage signal VPASS. The first boost voltage charge pump 2250 may generate the first boost voltage VPP having a more or relatively stable voltage level in response to a third pump control signal PP3. The third regulator 2260 may generate the third pump control signal PP3 in response to the first boost voltage VPP. The second boost voltage charge pump 2270 may generate the second boost voltage DVPP having a more or relatively stable voltage level in response to a fourth pump control signal PP4. The third regulator 2280 may generate the fourth pump control signal PP4 in response to the second boost voltage DVPP.

Figure 19:
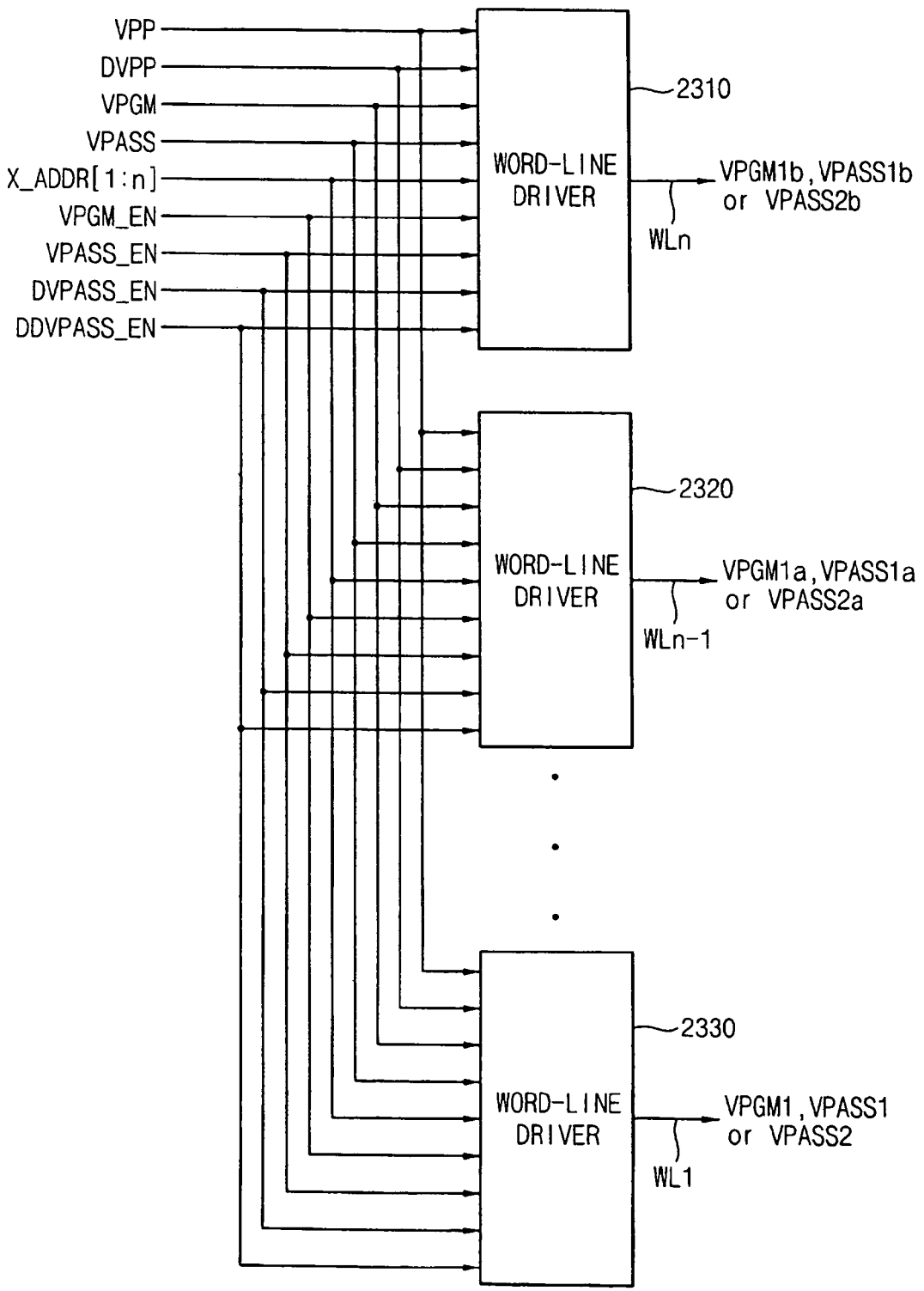
FIG. 19 is a circuit diagram illustrating a row decoder, according to another example embodiment.

FIG. 19 is a circuit diagram illustrating a row decoder, according to another example embodiment. The row decoder of FIG. 19 may be used as the row decoder 2300 included in the NAND-type flash memory device 2000 shown in FIG. 17.

Referring to FIG. 19, the row decoder 2300 may include word-line drivers 2310, 2320 and/or 2330.

The word-line driver 2330 may selectively transfer the program voltage signal VPGM1, the pass voltage signal VPASS1 and/or the pass voltage signal VPASS2 to word-lines based on the first boost voltage VPP, the second boost voltage DVPP, the program voltage signal VPGM, the pass voltage signal VPASS, one bit of the row address signal X_ADDR<1:n>, the program voltage enable signal VPGM_EN, the pass voltage enable signal VPASS_EN, the first reduced pass voltage enable signal DVPASS_EN and/or the second reduced pass voltage enable signal DDVPASS_EN.

The word-line driver 2320 may selectively transfer the program voltage signal VPGM1*a*, the pass voltage signal VPASS1*a* and/or the pass voltage signal VPASS2*a* to word-lines on the basis of the first boost voltage VPP, the second boost voltage DVPP, the program voltage signal VPGM, the pass voltage signal VPASS, one bit of the row address signal X_ADDR<1:n>, the program voltage enable signal VPGM_EN, the pass voltage enable signal VPASS_EN, the first reduced pass voltage enable signal DVPASS_EN and/or the second reduced pass voltage enable signal DDVPASS_EN.

The word-line driver 2310 may selectively transfer the program voltage signal VPGM1*b*, the pass voltage signal VPASS1*b* and/or the pass voltage signal VPASS2*b* to word-lines on the basis of the first boost voltage VPP, the second boost voltage DVPP, the program voltage signal VPGM, the pass voltage signal VPASS, one bit of the row address signal X_ADDR<1:n>, the program voltage enable signal VPGM_EN, the pass voltage enable signal VPASS_EN, the first reduced pass voltage enable signal DVPASS_EN and/or the second reduced pass voltage enable signal DDVPASS_EN.

Figure 20:
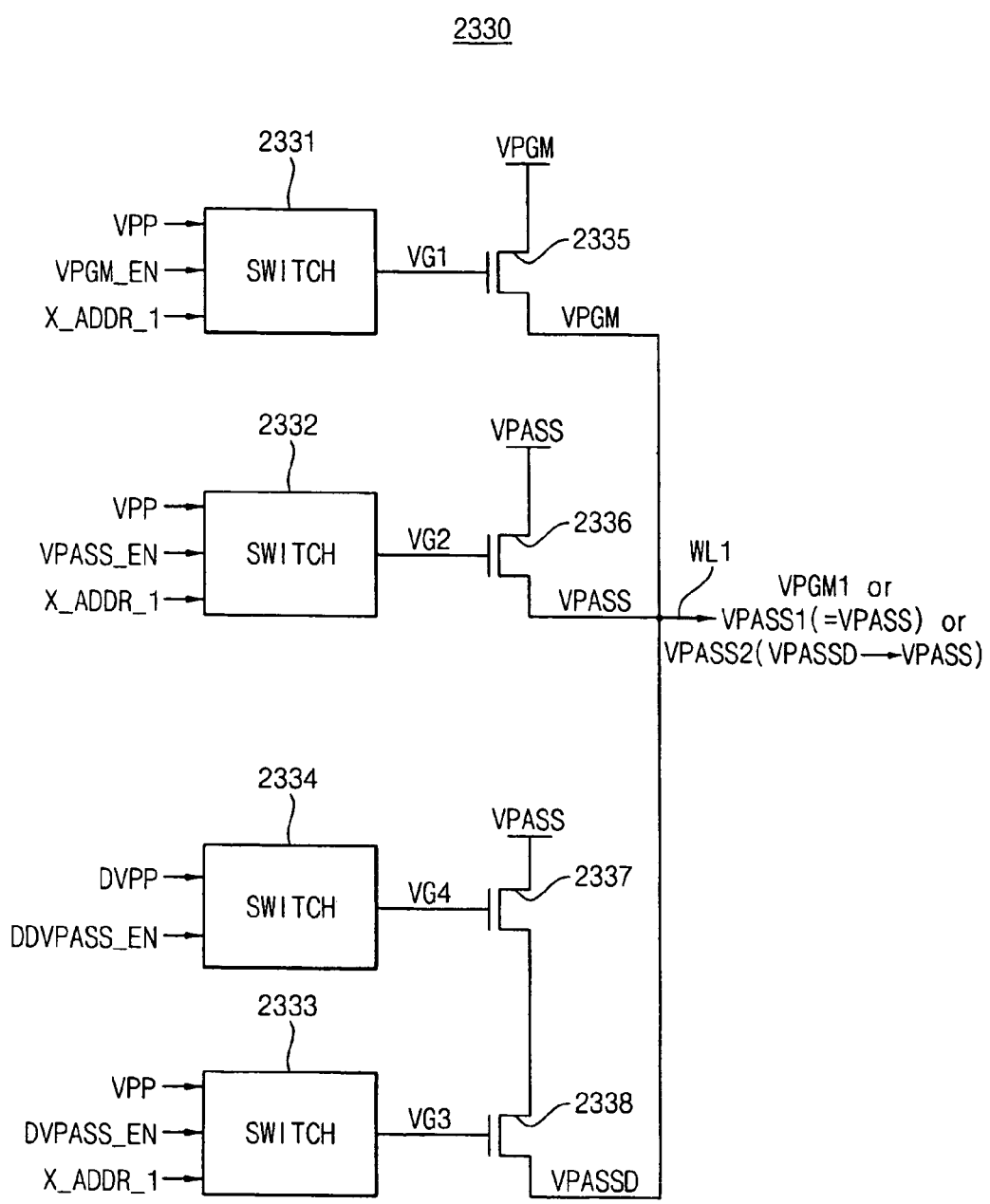
FIG. 20 is a circuit diagram illustrating a word-line driver, according to another example embodiment.

FIG. 20 is a circuit diagram illustrating a word-line driver, according to another example embodiment. The word-line driver of FIG. 20 may be used as the word-line driver 2330 included in the row decoder shown in FIG. 19.

Referring to FIG. 20, the word-line driver 2330 may include switches 2331, 2332, 2333, 2334, NMOS transistors 2335, 2336, 2337 and/or 2338.

The switch 2331 may generate a first gate control signal VG1 in response to the boost voltage VPP, the program voltage enable signal VPGM_EN and/or the first bit X_ADDR_1 of the row address signal. The NMOS transistor 2335 may output the program voltage signal VPGM to a word-line WL1 corresponding to the first bit X_ADDR_1 of the row address signal in response to the first gate control signal VG1. The switch 2332 may generate a second gate control signal VG2 in response to the boost voltage VPP, the pass voltage enable signal VPASS_EN and/or the first bit X_ADDR_1 of the row address signal. The NMOS transistor 2336 may output the pass voltage signal VPASS to a word-line WL1 corresponding to the first bit X_ADDR_1 of the row address signal in response to the second gate control signal VG2.

The switch 2333 may generate a third gate control signal VG3 in response to the first boost voltage VPP, the first reduced pass voltage enable signal DVPASS_EN and/or the first bit X_ADDR_1 of the row address signal. The switch 2334 may generate a fourth gate control signal VG4 in response to the second boost voltage DVPP and/or the second reduced pass voltage enable signal DDVPASS_EN.

The NMOS transistor 2337 has a drain to which the pass voltage signal VPASS may be applied and a gate to which the fourth gate control signal VG4 may be applied. The NMOS transistor 2338 has a gate to which the third gate control signal VG3 may be applied, a drain coupled to a source of the NMOS transistor 2337, and a source coupled to the word-line WL1 corresponding to the first bit X_ADDR_1 of the row address signal. Further, The NMOS transistor 2338 may output the reduced pass voltage signal VPASSD to the word-line WL1.

In the word-line driver 2330 shown in FIG. 20, the first program voltage signal VPGM1 corresponds to the program voltage signal VPGM, the first pass voltage signal VPASS1 corresponds to the pass voltage signal VPASS. In at least this example, the second pass voltage signal VPASS2 may transition to a voltage level of the reduced pass voltage signal VPASSD in response to the reduced pass voltage enable signal DVPASS_EN. Then, after a determined time, the second pass voltage signal VPASS2 may transition to a voltage level of the pass voltage signal VPASS in response to the pass voltage enable signal VPASS_EN.

In the word-line driver 2330 shown in FIG. 20, the level of the reduced pass voltage signal VPASSD may be determined by the level of the fourth gate control signal VG4 applied to the gate of the NMOS transistor 2337. For example, the reduced pass voltage signal VPASSD may have a voltage level equal or substantially equal to the difference between the fourth gate control signal VG4 and the threshold voltage VTH of the NMOS transistor 2337. The fourth gate control signal VG4 may be a voltage signal corresponding to the second boost voltage DVPP.

Figure 21:
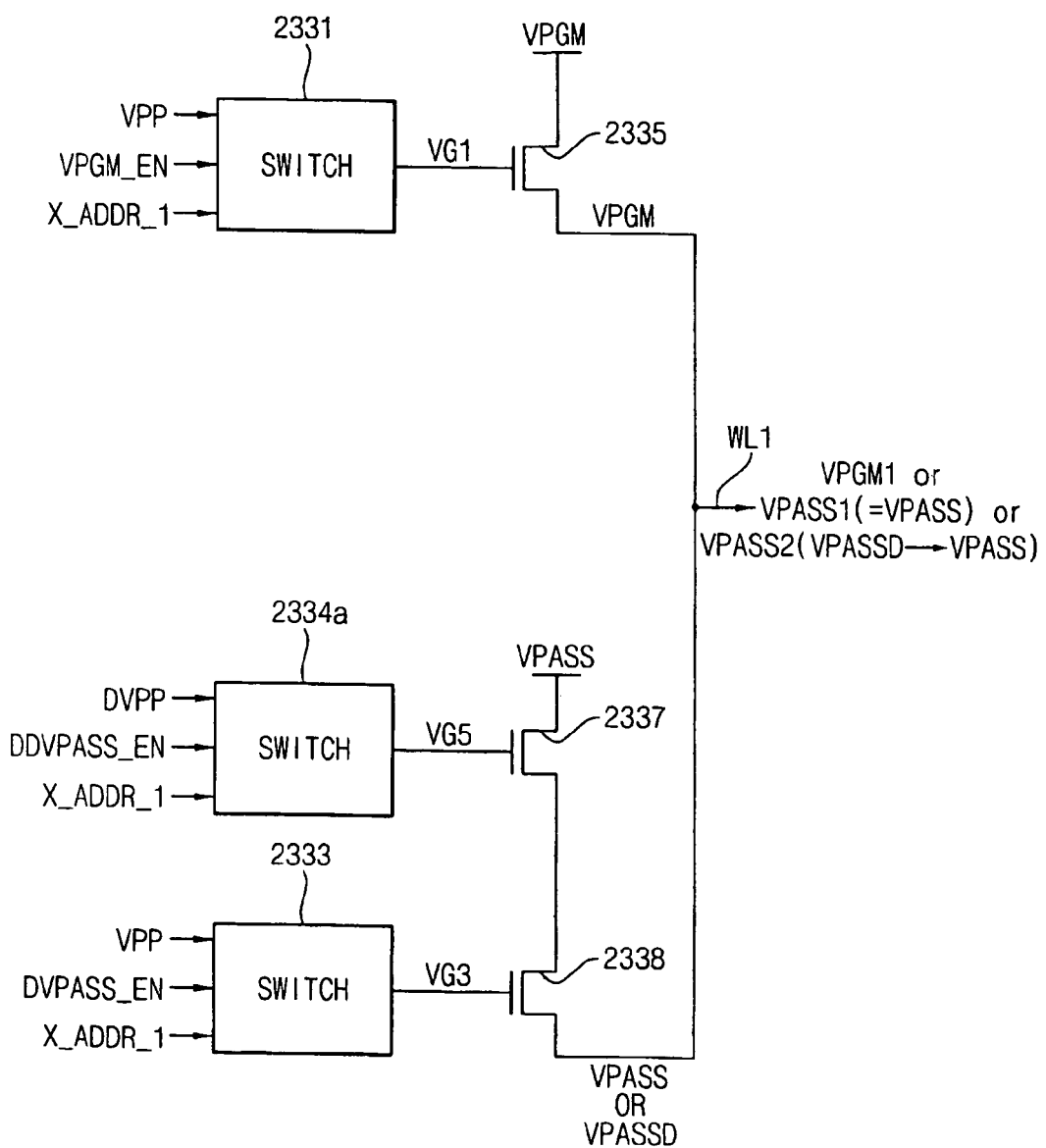
FIG. 21 is a circuit diagram illustrating a word-line driver, according to another example embodiment.

FIG. 21 is a circuit diagram illustrating a word-line driver, according to another example embodiment, which may be included in the row decoder 2330 shown in FIG. 19.

Referring to FIG. 21, the word-line driver 2330a may include switches 2331, 2333, 2334a, NMOS transistors 2335, 2337 and/or 2338.

The switch 2331 may generate a first gate control signal VG1 in response to the boost voltage VPP, the program voltage enable signal VPGM_EN, and the first bit X_ADDR_1 of the row address signal. The NMOS transistor 2335 may output the program voltage signal VPGM to a word-line WL1 corresponding to the first bit X_ADDR_1 of the row address signal in response to the first gate control signal VG1.

The switch 2333 may generate a third gate control signal VG3 in response to the first boost voltage VPP, the first reduced pass voltage enable signal DVPASS_EN, and the first bit X_ADDR_1 of the row address signal. The switch 2334a generates a fifth gate control signal VG5 in response to the second boost voltage DVPP, the second reduced pass voltage enable signal DDVPASS_EN and/or the first bit X_ADDR_1 of the row address signal.

The MOS transistor 2337 has a drain to which the pass voltage signal VPASS may be applied and a gate to which the fifth gate control signal VG5 may be applied. The NMOS transistor 2338 may have a gate to which the third gate control signal VG3 may be applied, a drain coupled to a source of the NMOS transistor 2337, and a source coupled to the word-line WL1 corresponding to the first bit X_ADDR_1 of the row address signal. Further, the NMOS transistor 2338 may output the pass voltage signal VPASS and the reduced pass voltage signal VPASSD to the word-line WL1.

In the word-line driver 2330a shown in FIG. 21, the first program voltage signal VPGM1 corresponds to the program voltage signal VPGM, the first pass voltage signal VPASS1 corresponds to the pass voltage signal VPASS. In at least this example, the second pass voltage signal VPASS2 may transition to a voltage level of the reduced pass voltage signal VPASSD in response to the reduced pass voltage enable signal DVPASS_EN. Then, after a determined time, the second pass voltage signal VPASS2 may transition to a voltage level of the pass voltage signal VPASS in response to the pass voltage enable signal VPASS_EN.

In the word-line driver 2330a shown in FIG. 21, the levels of the pass voltage signal VPASS and the reduced pass voltage signal VPASSD may vary according to the level of the second boost voltage DVPP. Accordingly, the word-line driver 2330a may be capable of generating the pass voltage signal VPASS and the reduced pass voltage signal VPASSD by adjusting the level of the second boost voltage DVPP. For example, the pass voltage signal VPASS or the reduced pass voltage signal VPASSD may have a voltage level equal or substantially equal to the difference between the fifth gate control signal VG5 and the threshold voltage VTH of the NMOS transistor 2337. The fifth gate control signal VG5 is a voltage signal corresponding to the second boost voltage DVPP.

An example operation of a NAND-type flash memory device, according to an example embodiment will be discussed with regard to FIG. 17-FIG. 21.

Referring to FIG. 17, a NAND-type flash memory device may use the first boost voltage VPP and the second boost voltage DVPP generated in the voltage generating circuit 2200, and may use the first reduced pass voltage enable signal DVPASS_EN and the second reduced pass voltage enable signal DDVPASS_EN generated in the program control circuit 2100.

Referring to FIG. 20, the second boost voltage DVPP and the second reduced pass voltage enable signal DDVPASS_EN may be applied to the switch 2334. The fourth gate control signal VG4, output from the switch 2334, may determine the level of the reduced pass voltage signal VPASSD. For example, the level of the reduced pass voltage signal VPASSD may be determined according to the level of the second boost voltage DVPP. Referring to FIG. 21, the second boost voltage DVPP, the second reduced pass voltage enable signal DDVPASS_EN and/or the first bit X_ADDR_1 of the row address signal may be applied to the switch 2334a. The fifth gate control signal VG5, output from the switch 2334a, may determine the levels of the pass voltage signal VPASS and the reduced pass voltage signal VPASSD. For example, the levels of the pass voltage signal VPASS and the reduced pass voltage signal VPASSD may be determined according to the level of the second boost voltage DVPP.

As mentioned above, the voltage signal, which may have a voltage level of the reduced pass voltage signal before the program voltage enable signal is activated and may transition to a voltage level of the pass voltage signal while the program voltage enable signal is activated, may be applied to an unselected word-line (or word-lines) adjacent to or directly neighboring the selected word-line. The reduced pass voltage signal may be applied to only the unselected word-line adjacent to or directly neighboring the selected word-line before the program voltage enable signal is activated may suppress and/or preventing a decrease in boosting efficiency of an unselected string. However, in some example embodiments, the voltage signal may be applied to several word-lines that are located near the selected word-line.

As mentioned above, the non-volatile semiconductor memory device according to at least some example embodiments, may decrease the effect of capacitance coupling between a selected word-line and an unselected word-line, and may suppress and/or prevent unwanted programming of memory transistors coupled to an unselected word-line of the selected string. Further, the non-volatile semiconductor memory device, according to at least some example embodiments, may not decrease the boosting efficiency of the unselected string by applying the above-described voltage signal.

While example embodiments have been described in detail, it should be understood that various changes, substitutions and alterations may be made herein without departing from the scope of the present invention.

What is claimed is:

1. A non-volatile semiconductor memory device, comprising:
    a row decoder configured to generate a program voltage signal, a pass voltage signal and a reduced pass voltage signal in response to a program voltage enable signal, a pass voltage enable signal, a reduced pass voltage enable signal, and a boost voltage, the reduced pass voltage signal having a voltage level lower than a voltage level of the pass voltage signal;
    a selected word-line coupled to a selected memory transistor, and configured to receive the program voltage signal in response to the program voltage enable signal; and
    a plurality of unselected word-lines including at least one word-line to which a first voltage signal is applied, the first voltage signal being configured to have a voltage level of the reduced pass voltage signal before the program voltage enable signal is activated and have a voltage level of the pass voltage signal while the program voltage enable signal is activated.

2. The non-volatile semiconductor memory device of claim 1, wherein the first voltage signal transitions to a voltage level of the reduced pass voltage signal in response to the reduced pass voltage enable signal, and transitions to a voltage level of the pass voltage signal in response to the pass voltage enable signal.

3. The non-volatile semiconductor memory device of claim 1, wherein a voltage signal configured to transition to a voltage level of the pass voltage signal in response to the pass voltage enable signal and configured to transition to a voltage level of the program voltage signal in response to the program voltage enable signal, is applied to the selected word-line.

4. The non-volatile semiconductor memory device of claim 1, wherein the first voltage signal is applied to at least one of the unselected word-lines adjacent to the selected word-line.

5. The non-volatile semiconductor memory device of claim 4, wherein the pass voltage signal is applied to the unselected word-lines not adjacent to the selected word-line in response to the pass voltage enable signal.

6. The non-volatile semiconductor memory device of claim 1, further including,
    a voltage generating circuit configured to generate the program voltage signal, the pass voltage signal and the boost voltage, and
    a control circuit configured to generate the program voltage enable signal, the pass voltage enable signal and the reduced pass voltage enable signal in response to a command signal and a row address signal.

7. The non-volatile semiconductor memory device of claim 6, further including,
    an address buffer configured to buffer external addresses to generate row addresses and column addresses,
    a column decoder configured to decode the column addresses to generate the decoded column addresses,
    a column gate configured to gate a first received data and a second data to be output, and
    a sense amplifier configured to amplify output data of the memory cell array to provide the amplified output data to the column gate, and configured to receive output data of the column gate to provide the received output data of the column gate to the memory cell array.

8. A non-volatile semiconductor memory device, comprising:
    a memory cell array including a plurality of memory transistors;
    a voltage generating circuit configured to generate a program voltage signal, a pass voltage signal and a boost voltage;
    a control circuit configured to generate a program voltage enable signal, a pass voltage enable signal and a reduced pass voltage enable signal in response to a command signal and a row address signal; and
    a row decoder configured to generate a first program voltage signal, a first voltage signal and a second voltage signal, the first program voltage signal transitioning to a voltage level of the program voltage signal in response to the program voltage enable signal, the first voltage signal transitioning to a voltage level of the pass voltage signal in response to the pass voltage enable signal, and the second voltage signal having a voltage level of the reduced pass voltage signal before the program voltage enable signal is activated, and having a voltage level of the pass voltage signal while the program voltage enable signal is activated.

9. The non-volatile semiconductor memory device of claim 8, wherein the first program voltage signal is applied to a first word line coupled to a selected memory transistor, and the second voltage signal is applied to a second word-line adjacent to the first word-line to which unselected memory transistors are coupled, and the first voltage signal is applied to a third word-line not adjacent to the first word-line.

10. The non-volatile semiconductor memory device of claim 9, wherein the first program voltage signal has a voltage level of ground voltage before the program voltage enable signal is activated, and has a voltage level of the program voltage signal while the program voltage enable signal is activated.

11. The non-volatile semiconductor memory device of claim 9, wherein the first program voltage signal has a voltage level of the pass voltage signal before the program voltage enable signal is activated, and has a voltage level of the program voltage signal while the program voltage enable signal is activated, the voltage level of the program voltage signal being higher than the voltage level of the pass voltage signal.

12. The non-volatile semiconductor memory device of claim 9, wherein the voltage generating circuit includes,
  a first charge pump configured to generate the program voltage signal in response to a first pump control signal,
  a first regulator configured to generate the first pump control signal in response to the program voltage signal,
  a second charge pump configured to generate the pass voltage signal in response to a second pump control signal,
  a second regulator configured to generate the second pump control signal in response to the pass voltage signal,
  a third charge pump configured to generate the boost voltage in response to a third pump control signal, and
  a third regulator configured to generate the third pump control signal in response to the boost voltage.

13. The non-volatile semiconductor memory device of claim 9, wherein the row decoder includes a plurality of word-line drivers, each of the word-line drivers being configured to generate the first program voltage signal, the first voltage signal, or the second voltage signal based on the boost voltage, the program voltage signal, the pass voltage signal, a first bit of the row address signal, the program voltage enable signal, the pass voltage enable signal and the reduced pass voltage enable signal.

14. The non-volatile semiconductor memory device of claim 13, wherein each of the word-line drivers includes,
  a first switch configured to generate a first gate control signal in response to the boost voltage, the program voltage enable signal and the first bit of the row address signal,
  a first transistor configured to output the program voltage signal to a word-line corresponding to the first bit of the row address signal in response to the first gate control signal,
  a second switch configured to generate a second gate control signal in response to the boost voltage, the pass voltage enable signal and the first bit of the row address signal,
  a second transistor configured to output the pass voltage signal to the word-line corresponding to the first bit of the row address signal in response to the second gate control signal,
  a third switch configured to generate a third gate control signal in response to the boost voltage, the reduced pass voltage enable signal and the first bit of the row address signal,
  a third transistor having a drain to which the pass voltage signal is applied and a gate coupled to the drain, and
  a fourth transistor having a gate to which the third gate control signal is applied, a drain coupled to a source of the third transistor and a source coupled to the word-line corresponding to the first bit of the row address signal, and configured to output the reduced pass voltage signal to the word-line.

15. The non-volatile semiconductor memory device of claim 9, wherein the reduced pass voltage enable signal includes a first reduced pass voltage enable signal and a second reduced pass voltage enable signal, and the boost voltage includes a first boost voltage and a second boost voltage.

16. The non-volatile semiconductor memory device of claim 15, wherein the first program voltage signal is configured to have a voltage level of the pass voltage signal before the program voltage enable signal is activated, and configured to have a voltage level of the program voltage signal while the program voltage enable signal is activated, the voltage level of the program voltage signal being higher than the voltage level of the pass voltage signal.

17. The non-volatile semiconductor memory device of claim 16, wherein the voltage generating circuit includes,
  a first charge pump configured to generate the program voltage signal in response to a first pump control signal,
  a first regulator configured to generate the first pump control signal in response to the program voltage signal,
  a second charge pump configured to generate the pass voltage signal in response to a second pump control signal,
  a second regulator configured to generate the second pump control signal in response to the pass voltage signal,
  a third charge pump configured to generate the first boost voltage in response to a third pump control signal,
  a third regulator configured to generate the third pump control signal in response to the first boost voltage,
  a fourth charge pump configured to generate the second boost voltage in response to a fourth pump control signal, and
  a fourth regulator configured to generate the fourth pump control signal in response to the second boost voltage.

18. The non-volatile semiconductor memory device of claim 16, wherein the row decoder includes a plurality of word-line drivers, each of the plurality of word-line drivers being configured to generate the first program voltage signal, the first voltage signal or the second voltage signal based on the first boost voltage, the second boost voltage, the program voltage signal, the pass voltage signal, a first bit of the row address signal, the program voltage enable signal, the pass voltage enable signal, the first reduced pass voltage enable signal and the second reduced pass voltage enable signal.

19. The non-volatile semiconductor memory device of claim 18, wherein each word-line driver includes,
  a first switch configured to generate a first gate control signal in response to the first boost voltage, the program voltage enable signal and the first bit of the row address signal,
  a first transistor configured to output the program voltage signal to a word-line corresponding to the first bit of the row address signal in response to the first gate control signal,
  a second switch configured to generate a second gate control signal in response to the first boost voltage, the pass voltage enable signal, and the first bit of the row address signal,
  a second transistor configured to output the pass voltage signal to the word-line corresponding to the first bit of the row address signal in response to the second gate control signal,
  a third switch configured to generate a third gate control signal in response to the second boost voltage and the second reduced pass voltage enable signal,
  a fourth switch configured to generate a fourth gate control signal in response to the first boost voltage, the first reduced pass voltage enable signal and the first bit of the row address signal, a third transistor having a drain to which the pass voltage signal is applied and a gate to which the third gate control signal is applied, and a fourth transistor having a gate to which the fourth gate control signal is applied, a drain coupled to a source of the third transistor and a source coupled to the word-line corresponding to the first bit of the row address signal, and configured to output the reduced pass voltage signal to the word-line.

20. The non-volatile semiconductor memory device of claim 19, wherein the third transistor is configured to decrease a voltage level of the third gate control signal by a threshold voltage of the third MOS transistor, the voltage level of the third gate control signal corresponding to the second boost voltage.

21. The non-volatile semiconductor memory device of claim 18, wherein each of the word-line drivers includes,
   a first switch configured to generate a first gate control signal in response to the first boost voltage, the program voltage enable signal and the first bit of the row address signal,
   a first transistor configured to output the program voltage signal to a word-line corresponding to the first bit of the row address signal in response to the first gate control signal,
   a second switch configured to generate a second gate control signal in response to the second boost voltage, the second reduced pass voltage enable signal, and the first bit of the row address signal,
   a third switch configured to generate a third gate control signal in response to the first boost voltage, the first reduced pass voltage enable signal, and the first bit of the row address signal,
   a second transistor having a drain to which the pass voltage signal is applied and a gate to which the second gate control signal is applied, and
   a third transistor having a gate to which the third gate control signal is applied, a drain coupled to a source of the second MOS transistor, and a source coupled to the word-line corresponding to the first bit of the row address signal, and configured to output the pass voltage signal or the reduced pass voltage signal to the word-line.

22. The non-volatile semiconductor memory device of claim 19, wherein the value of the second boost voltage is changed according to the first bit of the row address signal.

23. The non-volatile semiconductor memory device of claim 22, wherein the second switch is configured to decrease the second gate control signal by decreasing the second boost voltage when the word-line corresponding to the first bit of the row address signal is the second word-line that is directly neighboring the first word-line coupled to the selected memory transistor, and configured to increase the second gate control signal by increasing the second boost voltage when the word-line corresponding to the first bit of the row address signal is not the second word-line directly neighboring the first word-line coupled to the selected memory transistor.

24. The non-volatile semiconductor memory device of claim 22, wherein each of the word-line drivers is configured to output the program voltage signal when the word-line corresponding to the first bit of the row address signal is the first word-line coupled to the selected memory transistor, and configured to output the second voltage signal when the word-line corresponding to the first bit of the row address signal is the second word-line directly neighboring the first word-line, the second voltage signal having a voltage level of the reduced pass voltage signal before the program voltage enable signal is activated and a voltage level of the pass voltage signal while the program voltage enable signal is activated, and configured to output the first voltage signal having a voltage level of the pass voltage signal when the word-line corresponding to the first bit of the row address signal is not the second word-line directly neighboring the first word-line.

25. The non-volatile semiconductor memory device of claim 8, further including,
   an address buffer configured to buffer external addresses to generate row addresses and column addresses,
   a column decoder configured to decode the column addresses to generate the decoded column addresses,
   a column gate configured to gate a first data received from external and a second data to be output, and
   a sense amplifier configured to amplify output data of the memory cell array to provide the amplified output data to the column gate, and configured to receive output data of the column gate to provide the received output data of the column gate to the memory cell array.

26. A method of programming a non-volatile semiconductor memory device, comprising:
   providing a pass voltage signal to a first unselected word-line not adjacent to a selected word-line;
   providing a reduced pass voltage signal to a second unselected word-line adjacent to the selected word-line, the reduced pass voltage having a lower voltage level than a voltage level of the pass voltage signal;
   providing the pass voltage signal to the second unselected word-line; and
   providing a program voltage signal to the selected word-line when the pass voltage signal is provided to the second unselected word-line.

27. A method of programming a non-volatile semiconductor memory device, comprising:
   providing a pass voltage signal to a first unselected word-line not adjacent to a selected word-line;
   providing a reduced pass voltage signal to a second unselected word-line adjacent to the selected word-line, the reduced pass voltage signal having a lower voltage level than a voltage level of the pass voltage signal;
   providing the pass voltage signal to the selected word-line when the reduced pass voltage signal is provided to the second unselected word-line;
   providing the pass voltage signal to the second unselected word-line; and
   providing a program voltage signal to the selected word-line when the pass voltage signal is provided to the second unselected word-line.

* * * * *